United States Patent [19]
Abburi et al.

[11] Patent Number: 6,086,725
[45] Date of Patent: Jul. 11, 2000

[54] TARGET FOR USE IN MAGNETRON SPUTTERING OF NICKEL FOR FORMING METALLIZATION FILMS HAVING CONSISTENT UNIFORMITY THROUGH LIFE

[75] Inventors: Murali Abburi, Santa Clara; Seshadri Ramaswami, San Jose, both of Calif.

[73] Assignee: Applied Materials, Inc., Santa Clara, Calif.

[21] Appl. No.: 09/054,067

[22] Filed: Apr. 2, 1998

[51] Int. Cl.[7] .................................................. C23C 14/34
[52] U.S. Cl. ........................ 204/192.1; 204/298.01; 204/298.12; 204/298.13; 204/298.23
[58] Field of Search .......................... 204/192.1, 298.01, 204/298.12, 298.13, 298.23

[56] References Cited

U.S. PATENT DOCUMENTS

| | | | |
|---|---|---|---|
| 4,832,810 | 5/1989 | Nakamura et al. | 204/192.15 |
| 5,242,566 | 9/1993 | Parker | 204/298.2 |
| 5,320,728 | 6/1994 | Tepman | 204/192.12 |
| 5,334,267 | 8/1994 | Taniguchi et al. | 148/425 |
| 5,456,815 | 10/1995 | Fukuyo et al. | 204/298.13 |
| 5,540,821 | 7/1996 | Tepman | 204/192.13 |
| 5,833,770 | 11/1998 | Ominato et al. | 148/305 |

OTHER PUBLICATIONS

Y. Nakamura et al., "Influence of Permeability on Co Target Usage", Proc. of the 4th ISSP (Kanazawa, 1997), 6 pgs. including pp. 653–655.

Y.M. Ahn et al., "Study on Magneto–Optical TbFeCo Thin Films Magnetron–Sputtered From Targets With Low and High Magnetic Permeabilities", Samsung Electronics Co., LTD., Suwon, Korea, 1997, 3 pgs. (unnumbered).

*Primary Examiner*—Nam Nguyen
*Assistant Examiner*—Steven H. Ver Steeg
*Attorney, Agent, or Firm*—Fliesler, Dubb, Meyer and Lovejoy

[57] ABSTRACT

Improved targets for use in DC magnetron sputtering of nickel or like ferromagnetic face-centered cubic (FCC) metals are disclosed for forming metallization films having effective edge-to-edge deposition uniformity of 5%(3σ) or better. Such targets may be characterized as having: (a) a homogeneous texture mix that is at least 20% of a <200> texture content and less than 50% of a <111> texture content, (b) an initial pass-through flux factor (% PTF) of about 30% or greater; and (c) a homogeneous grain size of about 200 μm or less.

31 Claims, 11 Drawing Sheets

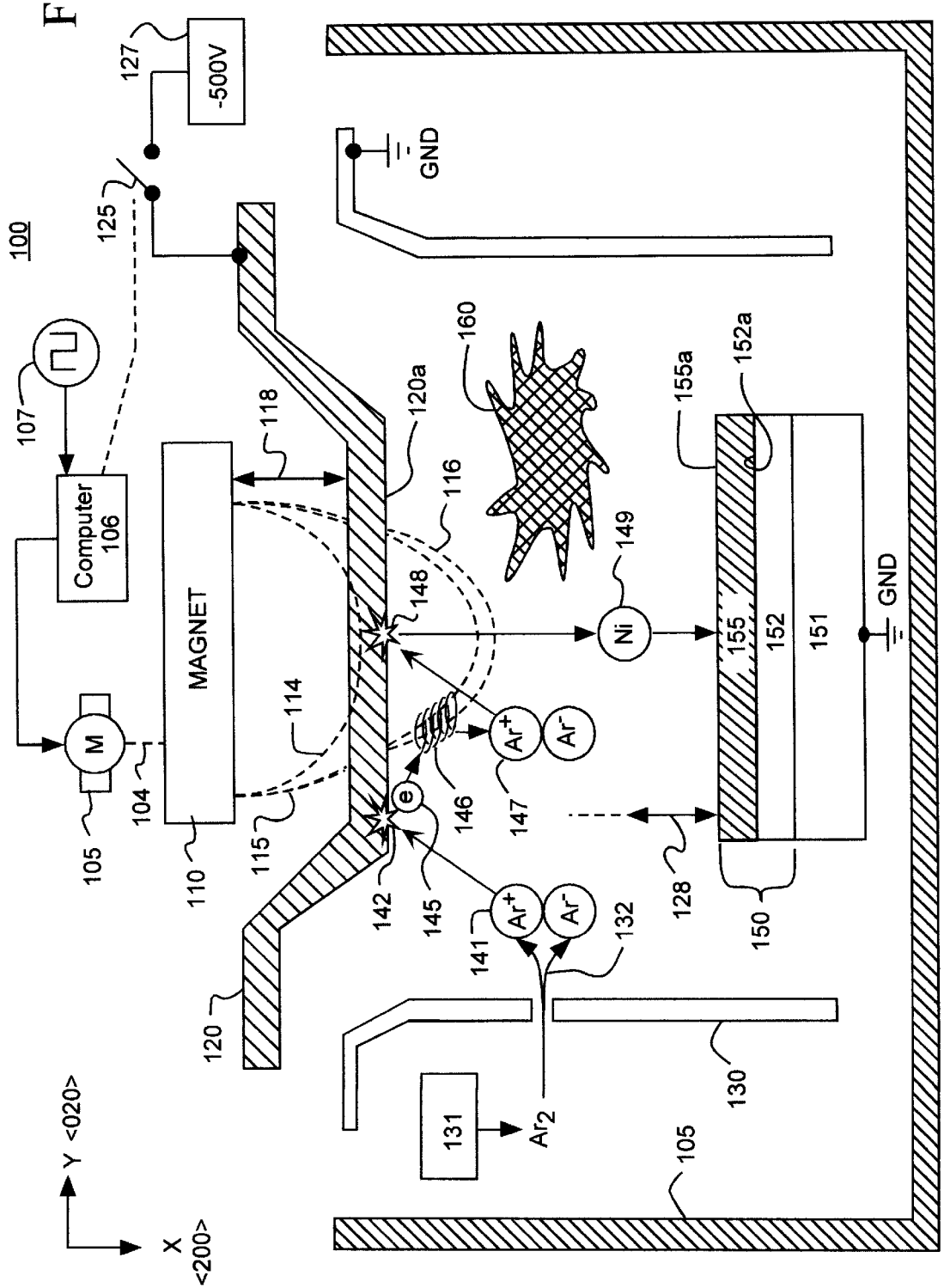

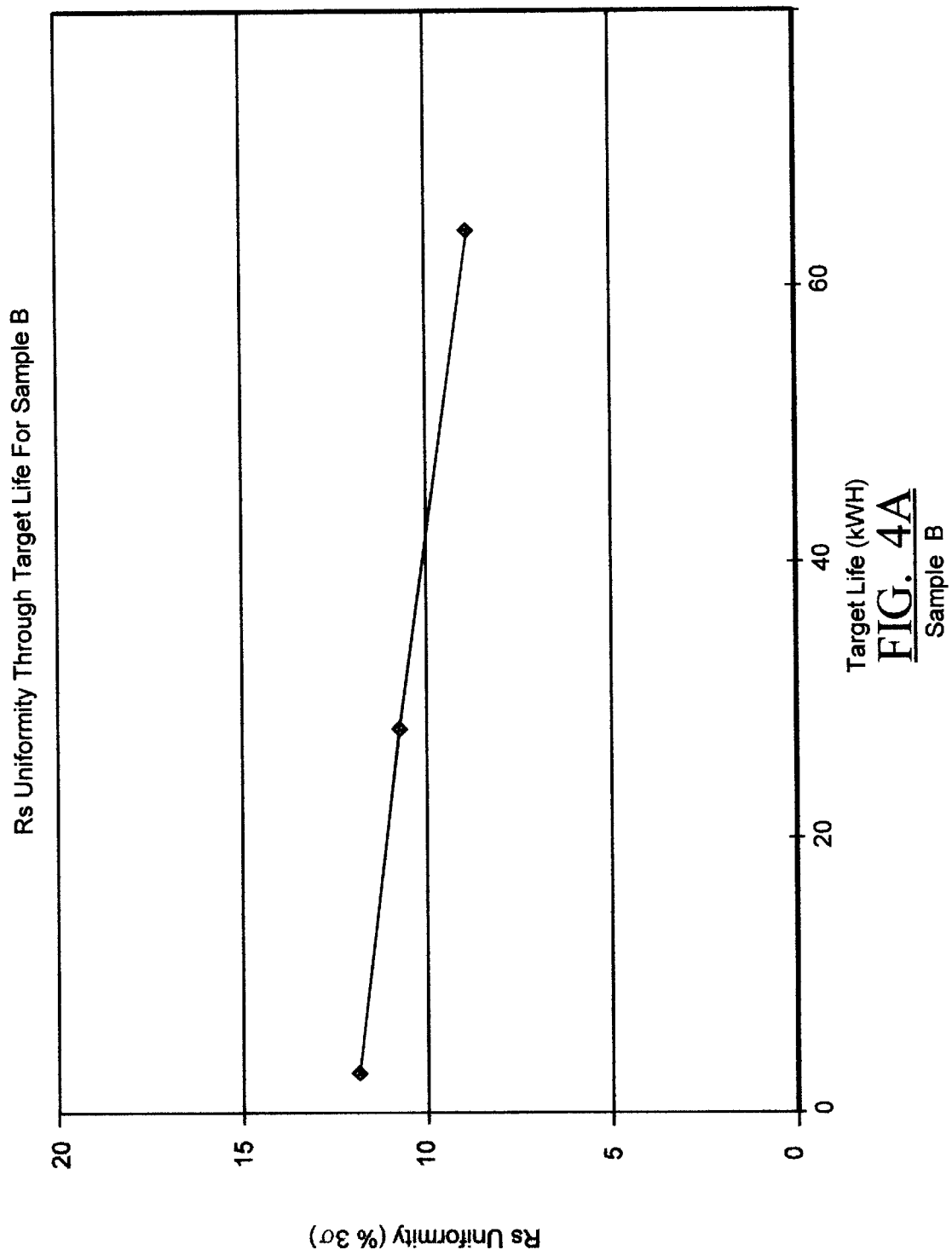

Uniformity vs. Target Life for Sample B

Sample B Target Surface Post Sputtering

Sample 'C'

Sample 'C'

Sample D1

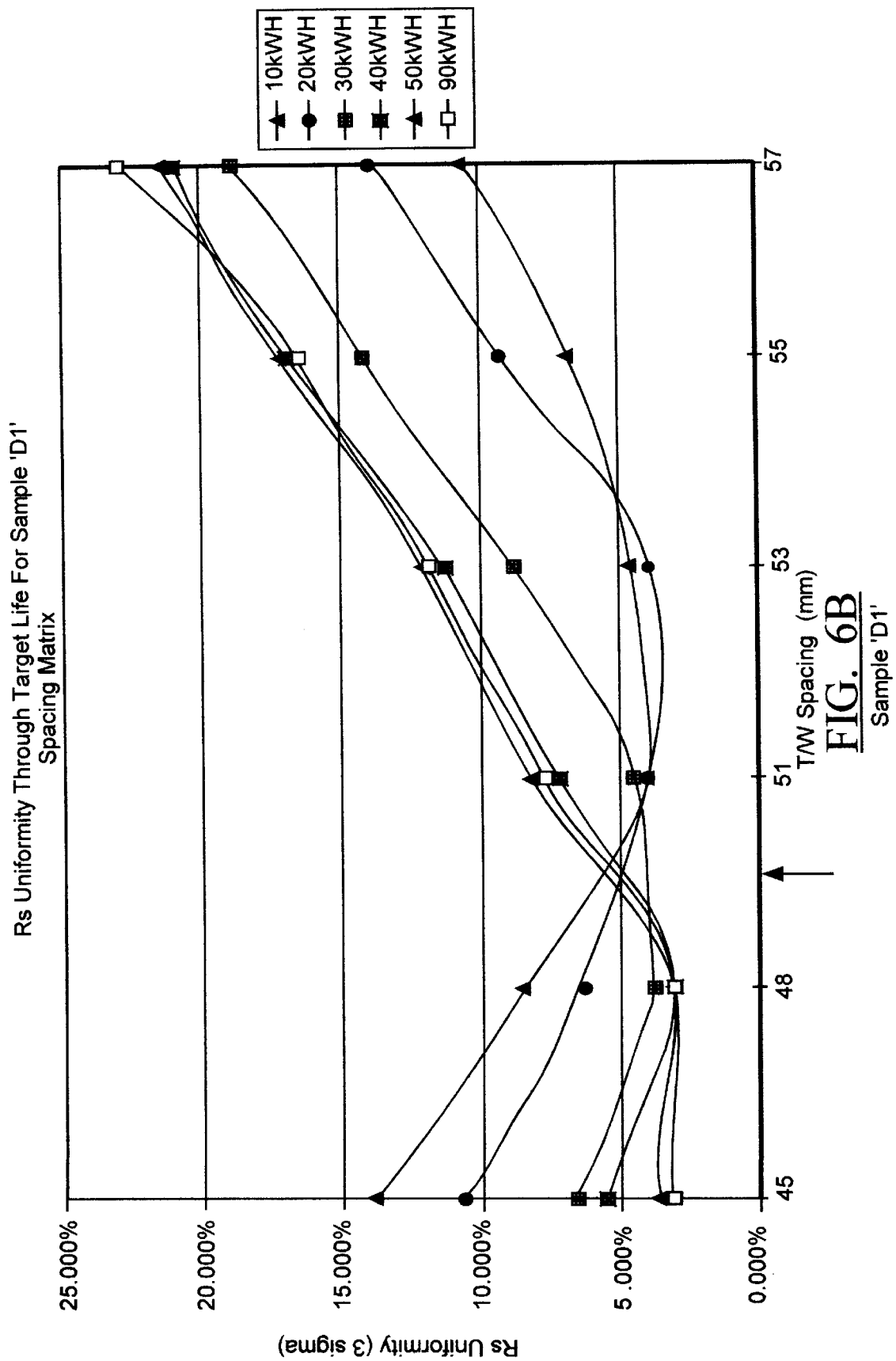

Sample 'D2'

Sample 'D2'

TARGET FOR USE IN MAGNETRON SPUTTERING OF NICKEL FOR FORMING METALLIZATION FILMS HAVING CONSISTENT UNIFORMITY THROUGH LIFE

BACKGROUND

1. Field of the Invention

The invention relates generally to physical vapor deposition (PVD) of metal films.

The invention relates more specifically to DC magnetron sputtering of ferromagnetic metals such as nickel (Ni) onto semiconductor substrates and the like for forming metallization such as found in the electrically-conductive interconnect layers of modern integrated circuits.

2a. Cross Reference to Related Patents

The following U.S. patent(s) is/are assigned to the assignee of the present application, and its/their disclosures is/are incorporated herein by reference:

(A) U.S. Pat. No. 5,242,566 issued Sep. 7, 1993 to N. Parker;

(B) U.S. Pat. No. 5,320,728 issued Jun. 14, 1994 to A. Tepman; and (C) U.S. Pat. No. 5,540,821 issued Jul. 30, 1996 to A. Tepman.

2b. Cross Reference to Related Other Publications

The following publication(s) is/are cited here for purposes of reference:

(a) Y. M. Ahn et al (Samsung Electronics, Korea), STUDY ON MAGNETO-OPTICAL TbFeCo THIN FILMS MAGNETRON-SPUTTERED FROM TARGETS WITH LOW AND HIGH PERMEABILITIES, Intermag 97 conference of April 1997; and (b) Y. Nakamura et al (Japan Energy Corp.), INFLUENCE OF PERMEABILITY ON Co TARGET USAGE, pp. 651–656, Proc. of $4^{th}$ ISSP (Kanazawa, Japan 1997), Jun. 4–6, 1997.

3. Description of the Related Art

The electrically-conductive interconnect layers of modern integrated circuits (IC) are generally of very fine pitch (e.g., 10 microns or less) and high density (e.g., hundreds of lines per square millimeter).

If there is nonuniformity of thickness or nonhomogeneity in other attributes of the precursor metal films that ultimately form the metallic interconnect layers of an IC, such lack of uniformity can lead to out-of-tolerance topographies and improper semiconductor fabrication. The latter can be detrimental to the operational integrity of the ultimately-formed IC. As such it is desirable to form metal films with good uniformity across each of mass-produced wafers.

The metal films of integrated circuits may be formed by physical vapor deposition (PVD). One low cost approach uses a DC magnetron sputtering apparatus such as the Endura™ system available from Applied Materials Inc. of California for sputtering metals onto semiconductor wafers or other like workpieces.

Aluminum (Al) is the most common metal that is deposited by DC magnetron PVD sputtering. Aluminum can be characterized as a polycrystalline, electrically conductive material whose crystals have a face-centered cubic (FCC) structure. One of the characteristics of Al is that it is an essentially nonmagnetic material. (Al may be considered paramagnetic though.)

Recently it has been proposed that magnetic metals such as nickel (Ni) may also be deposited using the Endura™ or like DC magnetron PVD systems.

Because nickel (Ni) is a ferromagnetic material, it presents new problems that had not been earlier posed by nonmagnetic materials such as aluminum. In particular, magnetic flux fields generated within the DC magnetron PVD system may be significantly altered due to shunting or short circuiting of the magnetic flux through the magnetically conductive material of ferromagnetic (e.g., Ni) targets. Such shunting can make it difficult to strike a plasma or sustain a generally-uniform plasma over time and can lead to associated problems such as nonuniform deposition. There is a question as to whether ferromagnetic targets of practical thicknesses (e.g., 3 millimeters or greater) can be used for sputtering with a DC magnetron PVD system.

The present inventors have through experimentation, isolated a number of physical attributes of ferromagnetic targets (e.g., nickel targets) that collectively correlate with how uniform the deposited film is across the substrate and how efficiently the material of the target is used. These collective correlations are disclosed herein together with designs for improved ferromagnetic targets.

SUMMARY OF THE INVENTION

It has been determined that fairly stable plasmas can be struck and sustained in DC_magnetron PVD systems even if ferromagnetic targets are used, and even if the targets have a thickness of as much as 3 mm or more.

Three attributes of nickel-based targets have been found to collectively correlate with uniform deposition thickness. They are in order of importance (with no one factor being dominant by itself): (1) the mix of crystallographic textures in the target, (2) the target's initial pass-through flux factor (% PTF), and (3) the maximum metal grain size in the target.

More particularly it has been found that; where the commercially useful life of nickel targets is limited by cross-workpiece deposition uniformity, an improvement can be obtained in the form of: (1) better deposition uniformity through the commercially useful life of nickel targets (e.g., a useful life of at least 60 KiloWatt Hours {kWHrs}), and/or (2) a longer commercially useful life for each nickel target in view of given limit on acceptable nonuniformity (e.g., cross-wafer resistivity variation of about 5% or less (at 3σ) over target life).

Such improvement in target longevity and/or deposition uniformity may be obtained first by providing, in ferromagnetic targets that have a thickness of as much as 3 mm or more: an average (with per-samplepoint restrictions), and more preferably, a homogeneous crystalline texture mix that is at least 20% of the <200> oriented texture. More preferably, the texture mix should at the same time be less than about 50% of the <111> oriented texture. Even more preferably, an average, and more preferably, a homogeneous texture mix should be provided that is at least 32% <200> texture, while further keeping at less than about 10% the <111> oriented texture. Yet more preferably, an average, and more preferably, a homogeneous texture mix should be provided that is at least 35% <200> texture, while further (optionally) keeping at less than 9% the <111> oriented texture. Yet more preferably, the latter homogeneous texture mix should further keep at less than 30% the <113> oriented texture. The remainder of the homogeneous texture mix can be of the <220> texture.

The above-mentioned average with per-sample-point restrictions may be determined for each value of texture in the texture mix by averaging over a multi-point symmetric pattern such as for example a star having four outer points and one central point. Star patterns with greater numbers of points can, of course, be alternatively used. The phrase, "with per-sample-point restrictions", indicates that each of the sample points participating in the average must further comply with a limited deviation such as being plus or minus 10% of the calculated average. By way of a more specific example, calling for a 20% average content of the <200> oriented texture with a per-sample-point restriction of +/−10% means that anyone of the sample points can be as low as 18% in content of the <200> oriented texture or as high as 22% in content of the <200> oriented texture, so long as the unweighted average is still 20%. In one embodiment, each of the above average specifications for each given type of oriented texture carries with it a per-sample-point restriction (PSPR) of +/−10%. In more tightly specified, second embodiment, each of the above average specifications for each given type of oriented texture carries with it a per-sample-point restriction of +/−5%. Other restriction values may be used provided they are no tighter than the margin of error for per-sample-point measurements and not so loose as to make the average value meaningless with respect to physical consequences (e.g., a per-sample-point restriction of greater than about +/−50%).

Improvement in target longevity and/or through-life deposition uniformity may be further obtained for such thick ferromagnetic targets (e.g. 3 mm or greater thickness) by simultaneously providing (for any one of the texture mixtures specified immediately above) an initial through-target pass-through flux factor (% PTF) that is at least high enough to initially strike a plasma and preferably a higher % PTF. An initial % PTF of about 30% or greater on average with a per-sample-point restriction of between +/−10% and +/−5% across the active (sputtering) portion of the target has been found workable for a permanent driving magnet of about 400 to 500 Gauss. More preferably, the initial % PTF of about 30% or greater should be found homogeneously across the active (sputtering) portion of the target rather than merely on a 5-point or other average.

Improvement in target longevity and/or through-life deposition uniformity may be further obtained by simultaneously providing with said texture mixtures and/or said initial % PTF, an average, and more preferably, a homogeneous grain size in the target of about 200 $\mu$m (200 microns) or less, where the grain size value is one provided by the E1172 measurement procedure of ASTM (American Standard Test of Materials) or by a substantially equivalent measurement method for grain size that takes into account grain size at the center and active edge of the target. More preferably, a grain size of about 150 $\mu$m or less should be provided. Even more preferably, a grain size of about 100 $\mu$m or less should be provided. The per-sample-point restriction (PSPR) for the average value of grain size should no more than about +/−10 $\mu$m and more preferably, no more than about +/−5 $\mu$m and even more preferably, no more than about +/−3 $\mu$m. By way of example, the above-mentioned preferred values for average grain size may be more specifically defined according using the following per-sample-point restrictions: 200 $\mu$m AVG +/−10 $\mu$m PSP; or 150 $\mu$m AVG +/−5 $\mu$m PSP; or 100 $\mu$m AVG +/−3 $\mu$m PSP.

Improved uniformity through the useful life of for such thick ferromagnetic targets (e.g., 3 mm or thicker nickel targets) may be yet better obtained by simultaneously providing all three of the above-described, preferred ranges for average or homogeneous texture mix, initial % PTF, and grain size.

A DC_magnetron PVD system in accordance with the invention comprises a ferromagnetic target having at least two of the following three characteristics: (a) a homogeneous texture mix that is at least 20% of the <200> oriented texture, (b) a homogeneous across-the-target, initial pass-through flux factor (PTF) of about 30% or greater, and (c) a homogeneous grain size of less than about 150 $\mu$m.

A method for operating a DC_magnetron PVD system in accordance with the invention comprises the step of: (a) installing a ferromagnetic target having at least two of the following 3 characteristics: (a.1) a homogeneous texture mix that is at least 20% of the <200> oriented texture, (a.2) a homogeneous across-the-target, initial pass-through flux factor of 30% or greater, and (a.3) a homogeneous grain size of less than 150 $\mu$m; and further comprises the step of: (b) adjusting the target to wafer spacing automatically during useful target operation so as to optimize uniformity due to target-to-workpiece spacing.

A target qualification method in accordance with the invention comprises the steps of: (a) testing supplied samples of respective lots of ferromagnetic targets for at least two of the following characteristics: (a.1) a homogeneous or average texture mix that is at least 20% of the <200> oriented texture, (a.2) a homogeneous or average across-the-target, pass-through flux factor of 30% or greater, and (a.3) an average grain size of less than about 150 $\mu$m AVG +/−5 $\mu$m PSP; and further comprises the step of: (b) proscribing use as targets for DC_magnetron sputtering operations where resistivity uniformity variation of no more than 5% (3$\sigma$) is desired, the targets from lots whose samples do not pass said at least two testing steps.

Other aspects of the invention will become apparent from the below detailed description.

BRIEF DESCRIPTION OF THE DRAWINGS

The below detailed description makes reference to the accompanying drawings, in which:

FIG. 1 is a schematic diagram of a DC magnetron PVD system;

FIG. 4A shows a plot of through-life uniformity of across-the-wafer deposition for a second nickel target (Sample 'B');

FIG. 6B plots target-to-wafer spacing curves relative to across-the-wafer deposition uniformity for the fourth nickel target (Sample D1);

DETAILED DESCRIPTION

Figure 2A:
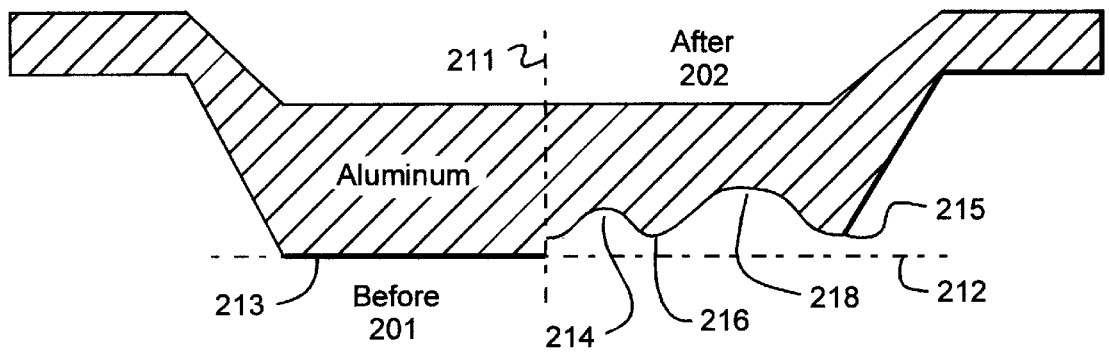
FIG. 2A shows before and after cross sections for demonstrating a typical erosion profile for a nonmagnetic target (e.g., aluminum)

FIG. 1 shows a schematic diagram of a DC sputtering magnetron system 100. In this schematic, the x-axis extends down while the y-axis extends laterally. The x-direction corresponds to a <200> FCC crystal orientation. The y-direction corresponds to a <020> Face Centered Cubic crystal orientation and is understood to alternatively represent a <002> FCC crystal orientation or any orientation that is intermediate along the yz plane between <020> and <002>, such as <022>.

In system 100, a magnet 110 (or a set of magnets, which can include moving and/or stationary permanent and/or electromagnets) is positioned over a portion of target 120. Typically, a spacing 118 between the magnet and target is provided by nonmagnetic shims or other nonmagnetic spacing means.

The target 120 is positioned over and spaced apart from a workpiece 150. A spacing 128, between the target and workpiece is referred to as the T/W spacing. This T/W spacing 128 may adjusted manually or automatically, such as by the illustrated stepper motor 105 which is arranged to move the combination of target 120 and magnet 110 up and down. The mechanical connection between motor 105 and the magnet/target combination 110/120 is represented by dashed line 104 and can be a lead screw or other means for converting the output of motor 105 into appropriate movement of the magnet/target combination. The direction and speed of motor 105 may be controlled by a programmable computer 106. T/W spacing 128 may be adjusted automatically by computer 106 for maintaining such spacing 128 to optimize uniformity over life in accordance with the disclosure of the above-cited U.S. Pat. No. 5,540,821 through the operational lifetime of the target 120. Such automatic adjusting of T/W spacing 128 is referred to herein as 'autospacing'.

Computer 106 may include a real-time clock 107 for keeping track of the accumulated sputtering time. Computer 106 may further include power measuring means for keeping track of the accumulated product of sputtering time times power (or of other like target deterioration parameters) of each target that is installed into system 100. In one embodiment, clock 107 keeps track of how long computer-controllable switch 125 is closed and the computer 106 calculates the amount of work done by target 120 as a function of applied power (voltage times current) integrated over time of switch closure.

The magnet 110 produces a flux field 115 of a given intensity. At least a portion 116, if not all of the produced flux 115 should pass through the target into the space 128 between the target 120 and the workpiece 150. If the target 120 contains ferromagnetic material such as nickel or a magnetic alloy of nickel (e.g., $Ni_{1-x}Si_x$, where $x \leq 1\%$), a portion 114 of the produced flux 115 may shunt through the target in a y-z direction rather than passing through into the space 128 between the target 120 and the workpiece 150. The relative amount of shunting (114/115) generally decreases as target thickness decreases. The relative amount of shunting (114/115) can also depend on other factors as will be seen. If, in contrast, the target 120 is primarily composed of a nonmagnetic material such as aluminum, there will be essentially no shunting and most if not all of the produced flux 115 passes as passed-through flux 116 into the T/W spacing 128.

The intensity and spatial extent of the passed-through magnetic flux 116 plays an important role in generating a sputter-causing plasma 160 and in determining uniformity of deposition as will be explained shortly.

The target 120 within the DC_magnetron PVD system is electrically conductive and is composed of a to-be-sputtered material. The to-be-sputtered material can include a variety of metals such as nonmagnetic aluminum in conventional systems and ferromagnetic metals such as nickel in systems in accordance with the present invention.

A plasma 160 is created and sustained in the space 128 between the target and the workpiece. Once created (struck) and sustained, the plasma bombards a sputtering surface 120a of the target with energized particles. This bombardment causes small particles of the to-be-sputtered material to break away from the target's sputtering surface 120a and to move to the workpiece 150 for deposition on the workpiece. As a result, the target erodes over time (that is, target thickness tends to decrease with usage) and deposition films are formed on a stream of workpieces 150 that pass under the target.

The initial target 120 is typically of a smooth symmetrical form such as a circular disk with a planar work surface, but may have various bends or other features such as shown for adaptively fitting into a specific DC_magnetron PVD system and for producing specific distributions of electrical field intensity, magnetic field intensity, and gas flow in accordance with design specifics of the receiving DC_magnetron PVD system. Each workpiece 150 also generally has a smooth symmetrical form such as a circular disk with a planar work surface at the start of deposition. One example is a pre-planarized semiconductor wafer. Typically, one target is used for depositing films 155 on many workpieces (e.g., at least 20 or more wafers).

The target 120 is typically structured for removable insertion into the corresponding DC_magnetron PVD system 100. Used targets are periodically replaced with a new targets given that the PVD process erodes away the to-be-deposited material of each target over time. The useful deposition life of the target, which life is typically measured in terms of kiloWattHours or in terms of total deposited, film thickness, is referred to as the target's useful life span.

A switching means such as computer-controlled switch 125 may be provided for selectively connecting the target 120 to a relatively negative voltage source 127. (The voltage and/or current of source 127 may also be computer-controlled.) In general, the negative voltage source 127 provides a DC cathode voltage in the range of about −470V to −530V relative to the potential on an opposed anode (ground or GND in the illustrated example). Higher voltages may be used for initially striking (igniting) the plasma 160. The specific cathode voltage varies according to design. When the switching means 125 is closed to connect the target 120 with negative voltage source 127, the target can act as a source of particles such as 145 ($e^-$) and 149 (Ni) which are discussed below. The target is also sometimes referred to as the cathode.

A tubular gas-containment shield 130, usually of cylindrical shape, is provided below and spaced apart from the target 120. Shield 130 is electrically conductive and is generally coupled to ground (GND) or to another relatively positive reference voltage so as to define an electrical field between the target 120 and the shield. Shield 130 has a plurality of apertures 132 (only one shown) defined through it for admitting a supplied flow of plasma-forming gas 131 such as argon (Ar) from the exterior of the shield 130 into its interior.

A workpiece-supporting chuck 151 is further provided centrally below and spaced apart from the target 120, usually within the interior of the shield 130. Chuck 151 is electrically conductive and is generally also coupled to ground (GND) or to another relatively positive reference voltage so as to define a further electrical field between the target 120 and the chuck.

Workpiece 150 is a replaceable item such as a planar semiconductor wafer and is supported on the chuck centrally below the target 120. Workpiece 150 originally consists of a substrate 152 having an exposed top surface 152a. As PVD sputtering proceeds, a metal film 155 having a top surface 155a builds up on the substrate 152. In many instances it is desirable that the build up or deposition of the metal film 155 be uniform across the entire top surface 152a of the substrate, from edge-to-edge. But as explained shortly herein, changes to the target 120 which develop over the useful life of the target can begin to interfere with homogeneous deposition. When the target can no longer provide a desired uniformity of edge-to-edge thickness of deposition for workpieces (e.g., wafers) 150 moving through the system 100, the useful life span of the target is deemed to be at its end.

The term 'edge-to-edge' as used herein does not require measurement from the absolute edge of the workpiece and allows for a peripheral exclusion zone such as commonly found in commercial production of semiconductor wafers. Typically, the exclusion zone of semiconductor wafers is approximately 3 mm for wafers of 150 mm (or 200 mm) diameter thereby giving an effective diameter of 144 mm (or 194 mm, respectively).

DC magnetron operation initiates as follows. When switching means 125 is closed, initial electric fields are produced between the target 120 and the shield 130 and the chuck 151. The plasma-creating gas 131 (e.g., Ar) is introduced. The illustrated assembly of FIG. 1 is usually housed in a low pressure chamber 105 (partially shown) that maintains an internal pressure in the range of about 2 mTorr to 5 mTorr or lower. An exhaust pump (not shown) may be provided to remove old gas and thereby allow replacement with new gas 131.

Some of the supplied gas 131 that enters the interior of shield 130 disassociates into positively charged ions (Ar$^+$) and negatively charged ions (Ar$^-$) when subjected to ambient photo electrons. The negatively charged ions (Ar$^-$) preferably move toward the positively-charged shield 130 while the positively charged ions (Ar$^+$) move toward the negatively-charged target 120.

One so-generated positive ion is shown at 141. Due to electrostatic attraction, ion 141 (Ar$^+$) accelerates towards and collides with the bottom surface 120a of the negatively-charged target at a first collision point, say 142. The point of collision is denoted with a star ("*"). This initial collision generally induces the emission of a first electron (e$^-$) 145 from cathode 120. (A particle of target material (Ni) may also be dislodged by the initial collision 142 but is not shown for sake of avoiding illustrative clutter.)

The emitted electron 145 drifts down towards the more positive chuck 151. However, the passed-through flux 116 of magnet 110 (if strong enough) confines the moving electron 145 to a spiraling trajectory as indicated at 146. This spiraling trajectory 146 moves the electron 145 through the feed gas (Ar$_2$) within the interior of the shield 130. Eventually the magnetically-confined electron 145 collides with a molecule of the feed gas 131. This second collision disassociates the Ar$_2$ molecule and produces another positively charged ion 147 (Ar$^+$) which accelerates towards and collides with the bottom surface 120a of the target. This new collision 148 produces yet another electron like 145.

Eventually, a chain reaction is established leading to the creation of a sustained plasma 160 within the interior of the gas-containment shield 130. Plasma 160 is charged positive relative to the cathode 120 and begins to act like a floating anode. This changes the electric field distribution within the DC_magnetron PVD system 100. At some point the electric field distribution stabilizes into a long term steady state such that plasma 160 is distributed in the space between target 120 and workpiece 150 and confined by the passed-through flux 116 of magnet 110.

The ignited and sustained plasma 160 acts as a source of bombardment particles such as 147.

It should be appreciated that the intensity and spatial extent of the passed-through flux 116 determines the behavior of spiraling electrons such as 145 and thereby determines characteristics of the plasma 160. The intensity and spatial extent of the passed-through flux 116 should be adjusted to fall within a workable range. If the passed-through flux 116 is too weak, it may be insufficient to provide an electron-confining tunnel. This would make the formation of a relatively stable and sustainable plasma 160 in the space between target and workpiece more difficult. It has been found that a good minimum working value for the passed-through flux 116 is about 90–100 Gauss.

If the passed-through flux 116 is too strong and extends much further down than shown, the plasma 160 may enlarge to a point where electrons destructively bombard the workpiece 150. Neither of the too-weak and too-strong flux conditions is desirable. In one embodiment, flux intensity just below the sputtering surface 120a should be between 100 Gauss and about 500 Gauss or more while flux intensity just above the workpiece top surface 152a/155a should be less than approximately 20 Gauss.

Ballistic collisions of massive particles such as particle 147 (Ar$^+$) with the bottom surface 120a of the target 120 is desirable however because they often cause small particles of the target's material to break off and move toward the underlying workpiece 150. An example of such an emitted target particle is shown at 149. At the beginning of a target's life span, the sizes and directions of the emitted target particles tend to produce a relatively uniform deposition of the emitted material (e.g., nickel or aluminum) on the top surface (152a and later 155a) of the workpiece 150.

Slight nonuniformities in the distribution of magnetic flux lines add up over time however to create nonuniform erosion profiles by the time a target reaches end life.

FIG. 2A provides a pair of side-by-side cross sectional views designated as 'before' (201) and 'after' (202). These before and after views, 201 and 202, respectively show the profile of a target's sputtering surface 120a at the start and end of the target's useful life. Line 211 represents an axial centerline of the target. Line 212 is a reference line for noting differences between the before and after conditions.

In the instance of FIG. 2A, the target 210 is composed of aluminum (Al). At the start of its operational life, the aluminum target 210 has an essentially planar sputtering surface 213 as seen on the 'before' side 201.

At or near the end of its useful life, the aluminum target 210 will have developed a nonplanar sputtering surface 215 characterized by grooves such as 214, 218 and by hills such as 216. Such grooves (218) and hills (216) tend to undesirably interfere with the edge-to-edge uniformity of deposition rate. At some point, the disparity between the target's grooves (218) and hills (216) causes too much edge-to-edge variation in the thickness of the deposited film 155 (FIG. 1), and the eroded target has to be replaced.

The length of the commercially useful life of a given target may be cut short by a number of different mechanisms, including by the development of a severely nonuniform erosion profile in the sputtering surface of the target. Such a cutting short of a target's useful life can disadvantageously increase production costs and increase wastage of material. Production costs may increase because of the increased number of times per lot that the production line has to be shut down to replace a target that has reached end-life. Material wastage may be seen as increasing when the total deposition of a short-lived target is compared to that of a target life that has a longer production life (e.g., as measured in KWhrs). A typical end-life point for a target that is used in production of semiconductor wafers is when across-the-wafer resistivity measurements on deposited metal show an electrical resistivity variation greater than about 5% ($3\sigma$) on workpieces produced by the target. If replacement becomes necessary due to a severely nonplanar erosion-profile, the target material that could have been otherwise sputtered but was not, is considered wasted material.

It is desirable to extend the commercially useful life of each target as much as practical so that less target material will be wasted and cost of production will be reduced. It is further desirable to extend each target's useful life as much as practical so that replacement frequency is reduced. Replacement time eats into production time and thereby disadvantageously decreases the workpiece throughput rate of the DC_magnetron PVD system.

Of course, when the severity of a target's grooves (218) and hills (216) becomes too much, such as shown by the end-life profile 215 in the 'after' portion 202 of FIG. 2A, it becomes necessary to replace the target in order to preserve the more-important edge-to-edge deposition uniformity on the workpiece 150 (FIG. 1).

Figure 2B:
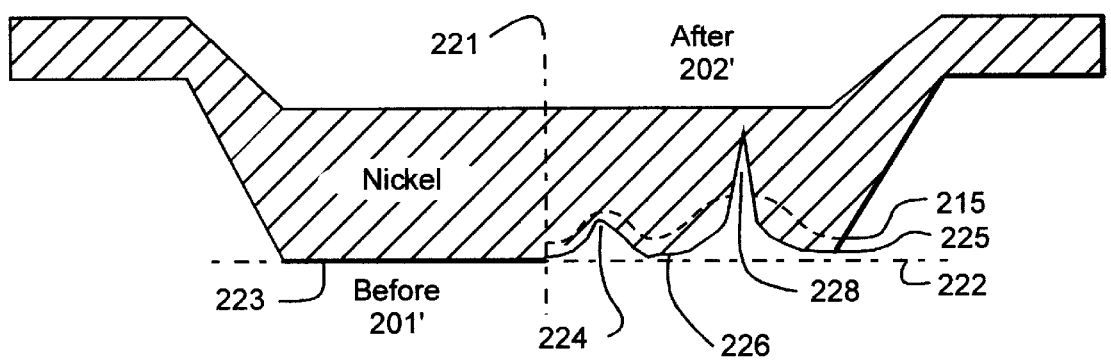
FIG. 2B shows before and after cross sections for demonstrating a typical erosion profile for a ferro-magnetic target (e.g., nickel)

FIG. 2B, like FIG. 2A, also provides a pair of cross sectional views designated as before (201') and after (202') that respectively show the profile of a target's sputtering surface at the start and end of the target's useful life. In the instance of FIG. 2B however, the target 220 is composed of a ferromagnetic material such as nickel. Like reference symbols in the '220–229' number series are used in FIG. 2B instead of numbers in the '210' decade of FIG. 2A to denote like elements.

For purposes of comparison, the erosion profile 215 of FIG. 2A is copied as a dashed curve 215' into FIG. 2B and placed appropriately relative to initial reference level 222.

FIGS. 2A and 2B do not represent any specific Al and Ni targets. Instead, these cross section diagrams are provided to explain a specific problem associated with ferromagnetic targets, namely, accelerated erosion due to de-shunted magnetic flux. This phenomenon is also sometimes referred to as a 'pinch-off'.

Note that grooves 224 and 228 of FIG. 2B have sharper, more V-like appearances than do the counterpart grooves 214 and 218 of FIG. 2A. Note that groove 224 is shallower than comparative groove 214 (FIG. 2A) relative to the reference level 222/212. Note that the peak of upside-down hill 226 is closer to reference level 222 than is the peak bottom of counterpart hill 216 relative to its reference line 212. All these differences between FIGS. 2A and 2B are believed to be due to the difference between the nonmagnetic nature of target 210 (FIG. 2A) and the ferromagnetic nature of target 220 (FIG. 2B).

As parts of the initial sputtering surface 223 of the ferromagnetic target 220 (FIG. 2B) erode away, target 220 becomes thinner. More of the sourced magnetic flux 115 (FIG. 1) passes through the thinned target as passed-through flux 116 (FIG. 1) and less is diverted as target-shunted flux 114. The increased intensity of the passed-through flux 116 alters the plasma's behavior and generally leads to faster production of bombardment particles (e.g., 147) in the area of the thinned section. This generally leads to a higher erosion rate at the thinned section. The increased erosion rate of the thinned section in turn generally leads to a higher, and thus non-uniform, deposition rate in the underlying area of the workpiece (150 of FIG. 1).

Just as in the case of the nonmagnetic target 210 (FIG. 2A), grooves and hills begin to form in the sputtering surface 223 of the ferromagnetic target 220 (FIG. 2B). More flux is de-shunted at the grooves than at the hills. This leads to accelerated bombardment at the deepest parts of the grooves and even faster groove formation at such relatively thinner sections of the target. It also leads to even higher, and thus non-uniform, deposition rates in the underlying area of the workpiece (150 of FIG. 1).

The sharp V-shaped profile of groove 228 is the end result of this self-enhancing (run-away) process. Groove 224 is shallower than counterpart groove 214 because the faster-eroding groove 228 shorten's the target's useful lifetime. Hill 226 is taller than counterpart hill 216 because the de-shunted magnetic flux of grooves 224 and 228 causes those grooves to grow faster than counterpart grooves 214 and 218.

As a consequence, the ferromagnetic target 220 (FIG. 2B) generally has a substantially shorter usable life than its counterpart nonmagnetic target 210 (FIG. 2A). Edge-to-edge deposition uniformity for the ferromagnetic target 220 tends to be worse than that of the counterpart nonmagnetic target 210. The material between erosion profile 225 and dashed counterpart profile 215' represents additionally wasted material that could have been but was not sputtered because of the ferromagnetic nature of target 220.

Figure 3A:
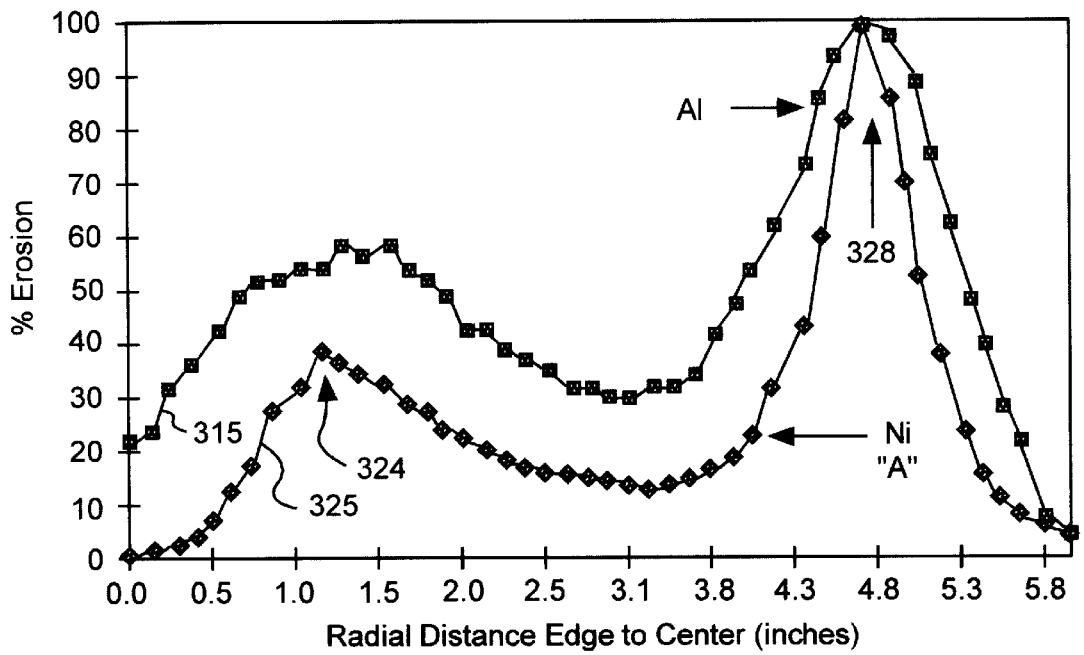
FIG. 3A contains plots for comparing relative erosion profiles of a conventional aluminum target and a first nickel target designated as Sample 'A'.

FIG. 3A shows results from experiments performed on an actual pair of like-shaped aluminum and nickel targets in a same DC_magnetron PVD system under essentially same operating conditions (magnet strength of about 500 Gauss). Cathode voltage was set at −500V. The Al target had a diameter of 300 mm (millimeters) and an initial thickness of 9 mm. The nickel target had a diameter of about 200 mm and had an initial thickness of 3 mm (around one third the thickness of the aluminum target). Each target was used for sputter depositing material on a series of like semiconductor wafers (8 inch, pre-oxidized wafers). The operating life of the aluminum target was 840 kWH (kilowatt Hours) and was terminated when greater than 6% ($3\sigma$) across-the-wafer resistivity variation was detected. The deepest groove (100% erosion) was seen at the 4.55 inch radius (approximately). This deepest groove was approximately three-quarters way through the 9 mm thickness of the aluminum target.

The operating life of the nickel target was 105 kWH and was terminated with punch-through (100% erosion) at the 4.55 inch radius (approximately).

FIG. 3A plots percent of erosion versus center-to-edge distance with 100% erosion at the deepest point of the deepest groove. Since the deepest groove in the aluminum target had a depth of around 6.8 mm, compared to the 3 mm depth of the deepest groove in the Ni target, it should be appreciated that the Al erosion profile 315 in absolute terms is more than twice as deep as the Ni profile at the 4.55 inch radius.

As seen in FIG. 3A, the erosion profile 325 of the nickel target is spaced below the erosion profile 315 of the aluminum target at essentially all radial distances except the 100% erosion point. The area between the two erosion profiles, 315 and 325, represents a greater relative amount of wasted material for the nickel sputtering process as compared to the counterpart aluminum sputtering process. Calculations indicate that less than about 20% of the material in the nickel target was consumed before pinchoff-dictated endlife was reached.

The sharp V-shapes at the deepest parts of nickel grooves 324 and 328 supports a conclusion that a pinch-off mechanism was in effect during the nickel sputtering process and was hastening end-of-life for the target. This is to be contrasted with the smoother shape at the deepest parts of aluminum grooves.

The nickel target that was used for the experiment of FIG. 3A was a first of five differently-manufactured nickel targets and this first sample was designated as Sample 'A'. The other four nickel targets were respectively designated as Sample 'B', 'C' and 'D1' and 'D2'.

The five, samples of nickel targets: 'A' through 'D2' were obtained from four different target manufacturing companies (A, B, C, and D) but had essentially same shapes, including a 3 mm thickness and a 200 mm diameter. The specific process used by each such target manufacturing company is believed to be a trade secret of that company and is not known to the present inventors. Samples 'D1' and 'D2' were respectively obtained for experimental purposes in the early and late parts of the year 1997 from Japan Energy Corp. of Japan, which company provided these experimental samples in confidential response to specifications provided by the present inventors with shape adaptations made for fitting into the 'Applied Materials Endura®' sputtering tool. Companies A, B, and C similarly each provided their respective experimental sample in confidential response to specifications provided by the present inventors with shape adaptations made for fitting into the 'Applied Materials Endura®' sputtering tool.

It may be appreciated from the below, Table 1 characterizations of samples 'A'–'D2' that different manufacturing processes where used because each sample demonstrated unique attributes.

It is known in the art that target attributes can vary as a function of: (1) the mine or other source from which metal ore is obtained; (2) the purification process used for purifying the metal ore (into high purity nickel); (3) the casting process used for melting and recrystallizing the purified metal; (4) the forging or metal working processes used for shaping the cast metal: (5) the machining processes used for giving each target its final shape; and (6) any annealing or other treatments applied to the target material during manufacture of the target. As such, the specific identities of companies A, B and C is irrelevant because alternative, target manufacturing processes may be used to create targets in accordance with specifications of the present invention. Company D is identified herein simply to demonstrate at least one such company that may create targets in accordance with specifications set forth herein.

Each of the five, differently-manufactured nickel targets was characterized with respect to material purity, texture mix, metal grain size, magnetic permeability, and initial, average pass-through flux factor (% PTF) as indicated by below Table 1. (The initial, average % PTF value may not be equal to spot % PTF values present during sputtering.) The last two columns of Table 1 show observed edge-to-edge deposition uniformity on the respective workpieces of each sampled target (as measured by resistivity profiling) and the corresponding lifetime (measured in KiloWattHours) for which the stated constraint on deposition uniformity held true.

Although it is quickly seen that sample 'D1' exhibited the best edge-to-edge deposition uniformity for the longest time (<5% over 90 kWHRS) among the five samples, there are lessons to be learned from each tested sample.

TABLE 1

| Ni Sample | Purity | Texture Mix (percent) | | | | TFM*** | Grain Size | | | Thu-Life Uniformity | Life (KW- |
| --- | --- | --- | --- | --- | --- | --- | --- | --- | --- | --- | --- |
| | | <111> | <113> | <200> | <220> | | μm | $\mu_{max}$ | % PTF | (3σ) | hrs) |
| A | 4N | 2.2 | 11.6 | 8.1 | 78.1 | 20 | 200 | 250 | 14 | <10% | 20 |
| B | 4N8 | 4 | 13 | 16 | 77 | 57 | 500 | 16 | 55 | <10% | 60 |
| C | 4N | 40 | 28 | 14 | 18 | 8 | 100 | 35 | 45 | <10% | 3 |
| D1 | 4N8 | 9.0 | 31.8 | 32.8 | 21.6 | 211 | 170 | 50 | 30 | <5% | 90 |
| D2 | 4N8 | 46 | 12.73 | 23.25 | 16.7 | 57 | 130 | 50 | 30 | <5% | 50 |
| D1/D2** | | 0.20 | 2.50 | 1.41 | 1.29 | | 1.31 | 1.00 | 1.00 | 1.00 | 1.80 |

TFM = 12*Power(<200>, 2.5)/(<111> + <113> + <111><113><220>/20)

In Table 1, the designation 4N means four 9's or 99.99% atomic purity. The designation 4N8 means 99.998% purity. The column at the extreme right labeled "Life" indicates the number of kilowatt hours of operation for which the uniformity constraint held true. Thus for sample 'D1', the uniformity constraint of <5% held true for the first 90 kWHrs of operation while for sample 'D2' the uniformity constraint of less than 5% held true for only 60 kWHrs and became substantially worse thereafter. For each given sample, it is understood that uniformity tends to become worse as usage increases and the erosion profile becomes more severe. Auto-spacing was used for each tested sample so as to obtain the best possible edge-to-edge deposition uniformity over life as influenced by target-to-workpiece spacing.

The initial pass-through flux factor (% PTF) defines what percentage of the sourced magnetic flux 115 initially (before erosion) passes through the target to define the passed-through flux 116. Initial % PTF is generally inversely related to magnetic permeability ($\mu_{max}$) Higher permeabilities correlate with lower % PTF's and vice versa. % PTF is also generally inversely related to target thickness. Thicker targets correlate with lower % PTF's and vice versa. Of course, very thin targets (e.g., much less than 3 mm thick) also correlate with relatively short, commercially-useful lifespans. As such, it is desirable to use ferromagnetic targets that are at least 3 mm thick, and preferably thicker, but not so thick as to lower the initial % PTF's below an acceptable range such that it is no longer possible to strike and sustain a plasma.

The double-asterisked () row marked as D1/D2 merely provides a mathematical division of the results for the respective rows of samples D1 and D2. It does not show actual experiment results. Similarly, the triple-asterisked (*) column marked as TFM merely provides a mathematical Texture Figure of Merit calculated as:

$$TFM = \frac{12 * Power(\langle 200 \rangle \cdot 2.5)}{(\langle 111 \rangle + \langle 113 \rangle + \langle 111 \rangle \langle 113 \rangle \langle 220 \rangle / 20)}$$

where Power(a,b) means value a raised to the b_th power.

This TFM value does not represent actual experimental results. It does, however correlate roughly with the observed kWHrs (except as applied to sample 'D2'). The TFM formula is configured in accordance with our deduction of a strong, beneficial influence of <200> texture content and a lesser, detrimental influence of the <111> texture and an even lesser, detrimental influence of the <113> texture. Other formulations may be deduced, if desired, from experimental results with larger numbers of points in the characterizing dimensions and use of DOE software analysis (Design of Experiment software).

As seen from the above Table 1, the different manufacturing processes for respective samples 'A' through 'D2' provided nickel targets with percent of <200> texture content ranging from as low as about 8% to as high as about 33%. The different manufacturing processes also provided experimental nickel targets with percent of <111> texture content ranging from as low as about 2% to as high as about 46%. The different manufacturing processes further provided nickel targets with % PTF ranging from as low as 14% to as high as 55% for the same 3 mm thickness. The different manufacturing processes correspondingly provided nickel targets with magnetic permeabilities ($\mu_{max}$) ranging from as low as 16 to as high as 250. The different manufacturing processes additionally provided nickel targets with grain size ranging from as low as about 100 $\mu$m to as high as about 500 $\mu$m.

Thus, it is seen that target characteristics such as texture mix, initial % PTF, magnetic permeability ($\mu_{max}$) and grain size can be controlled by choice of manufacturing process. The intensity of the sourced magnetic flux 115 in all the experiments described herein was 500 Gauss constant. (It is within the contemplation of the invention to use a variable magnetic source that decreases in intensity over time and/or at spots where thickness is much smaller than at others. The latter spots may be identified by recording erosion profiles of a sample target over target life time. FIG. 3A is an example of one such erosion profile.)

Texture mixture is believed to play an important, but not fully-decisive, role in determining target longevity and/or through-life deposition uniformity. More specifically, the <200> oriented texture is believed to be that which preferentially correlates with longer target life and more uniform deposition when such <200> oriented texture is provided in sufficient quantity. Opposingly, the <111> oriented texture is believed to be that which correlates with shorter target life and less uniform deposition when such <111> oriented texture is provided in excessive quantity (e.g., above a threshold level of about 10%). To a lesser extent, the <113> oriented texture is believed to be that which correlates with shorter target life and less uniform deposition when such <113> oriented texture is provided in combination with <111> oriented texture and such <113> oriented texture is provided in excessive quantity (e.g., above a threshold level of about 13%).

The specific mechanisms at work is not fully understood. The combination of <111> and <113> oriented texture is believed to be responsible for causing an undesirable shunting of magnetic flux laterally through sporadic spots in the target instead of allowing the shunted flux to pass-through vertically into the space between target and workpiece. This can lead to nonuniform de-shunting at such sporadic spots, and hence, nonuniform deposition. The detrimental effects of the combination of <111> and <113> oriented texture may be seen in the results of sample 'C' as provided by Table 1. Despite good, small grain size (100 $\mu$m) and relatively high initial % PTF (45%), sample 'C' exhibited the worst results of all the samples. This is believed to be due in part to the detrimental effects of the combination of <111> and <113> oriented textures with respective high percentage values of 40% and 28%. Cold-rolling asymmetry was observed in sample 'C'. This probably also contributed to the poor uniformity and lifespan results of sample 'C'.

The effect of the <220> texture appears to be one that by itself is neither extremely beneficial nor extremely harmful to determining target longevity and/or through-life deposition uniformity. However it may be detrimental when combined with relatively large quantities of <111> and <113>. It is noted that samples 'A' and 'B' have roughly same <220> texture content and yet exhibit different lifespan values. Similarly, samples 'C' and 'D2' have roughly same <220> texture content and yet exhibit different lifespan values.

Before deducing further concepts from Table 1, the experiments which produced the results of Table 1 will be examined.

Figure 3B:
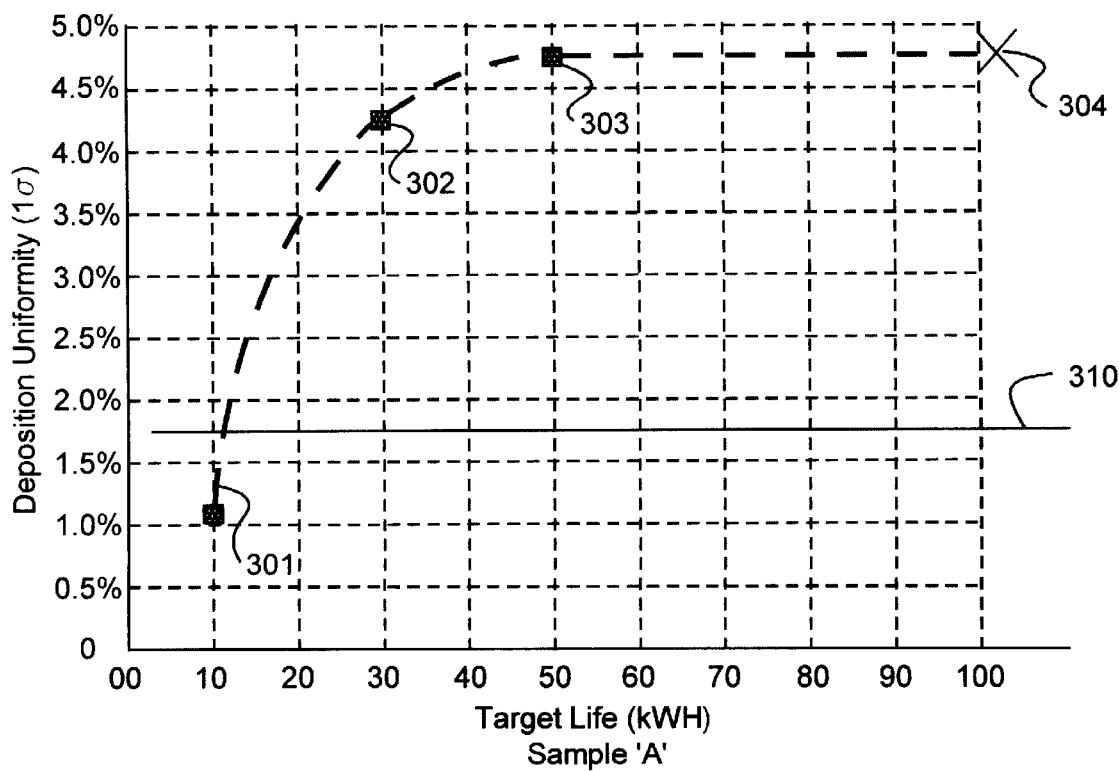
FIG. 3B is a plot showing over-target-life deterioration of deposition uniformity for the first nickel target (Sample 'A')

FIG. 3B shows the results of further measurements on the workpieces produced by the sample 'A' nickel target.

Marker 301 represents the results of uniformity measurements by way of 49-point electrical resistivity measurements made on the deposited films after the first 10 kWH of target life. Resistivity variation (which correlates with variation in deposition thickness and/or deposition granularity of the sputtered-on metal) was about 1.2% for the bulk of the 1a sampling population as seen over the effective edge-to-edge area of each tested wafer (where 'effective edge-to-edge area' does not include the peripheral 3 mm exclusion zone). Commercial production usually requires less than 1.7% thickness variation from effective edge-to-edge of deposition among the 1$\sigma$ bulk portion of the samples (or less than 5% thickness variation among the 3$\sigma$ primary portion of the samples). This typical commercial requirement is represented by reference line 310. Useful life of target is measured by the number of production hours (or by kWHrs or by accumulated deposition thickness) of a given target. In FIG. 3B, useful life of target may be interpreted to end when the deposition uniformity curve crosses upwardly through limit level 310 for commercial usability. For the second order approximating curve, the limit crossing occurs at about 12 kWHrs in FIG. 3A. At about 15 kWHrs, the approximating curve crosses upwardly through the 2.5% (1σ) level, which level is basically equivalent to a 7.5% (3σ) level. At about 20 kWHrs, the approximating curve crosses upwardly through the 3.3% (1σ) level, which level is basically equivalent to a 10% (3σ) level. At about 30 kWHrs, the approximating curve crosses upwardly through the 4.3% (1σ) level, which level is basically equivalent to a 13% (3σ) level.

Marker 302 represents the results of uniformity measurements after 30 kWH of operation for the same sample 'A' target. As seen, the 1σ results are substantially in excess of the desired ones whose ceiling is marked by the commercial-usefulness limit, 310.

Marker 303 represents the results of uniformity measurements after 50 kWH of operation for the same sample 'A' target. As seen, the 1a variation results are slightly worse than those for mark 302. Further measurements were taken of workpiece results to punchthrough point 304 (105 kWH) but these were essentially flat with the previous results and are therefore not specifically marked off. Visual observations indicated that the results probably plateau after mark 303. Second order interpolation for the three taken points, 301–303, indicates that the commercially useful life of the sample 'A' target is less than about 12 kWH if one wishes to remain under the 1.7% reference line 310. The large fluctuation of edge-to-edge deposition uniformity results, with most being in excess of 5% (3σ) during the lifetime of the sample 'A' target makes the sample 'A' target generally unacceptable for cost-efficient, commercial quality production.

Figure 4B:
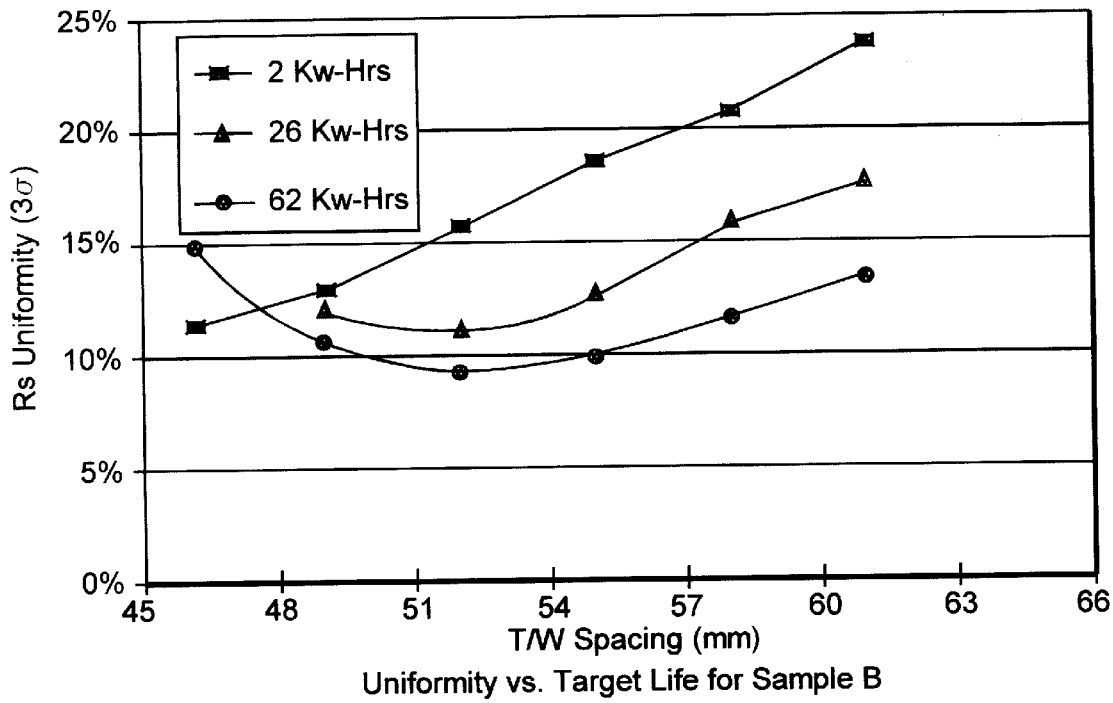
FIG. 4B plots target-to-wafer spacing curves relative to across-the-wafer deposition uniformity for the second nickel target (Sample 'B')
Figure 4C:
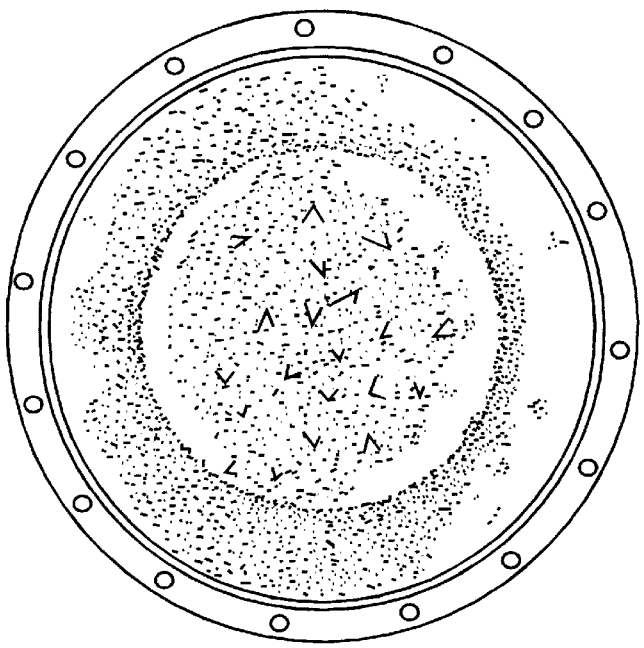
FIG. 4C is a photograph showing sand dune structures on the surface of the second nickel target (Sample 'B') after sputtering.

FIG. 4A shows experimental results for the sample 'B' target with auto-spacing mimicked. (FIG. 4B shows the underlying T/W spacing experiments that led to FIG. 4A.) As seen in FIG. 4A from the drawn lines that connect the 3 sample points, the <10% (3σ) line is crossed over at about 45 kWHrs but the results are continuously above 5% (3σ) throughout the 60 kWHr test life of the sample 'B' target. Over-life improvement in the uniformity value is believed due to development of higher % PTF values as target thickness shrinks by consumption. FIG. 4C shows a surface at the end of the 60 kWHrs use of sample 'B' with significant sand dune structuring. Large grain size is believed to be responsible for this nonhomogeneous scarring of the target surface.

Figure 5A:
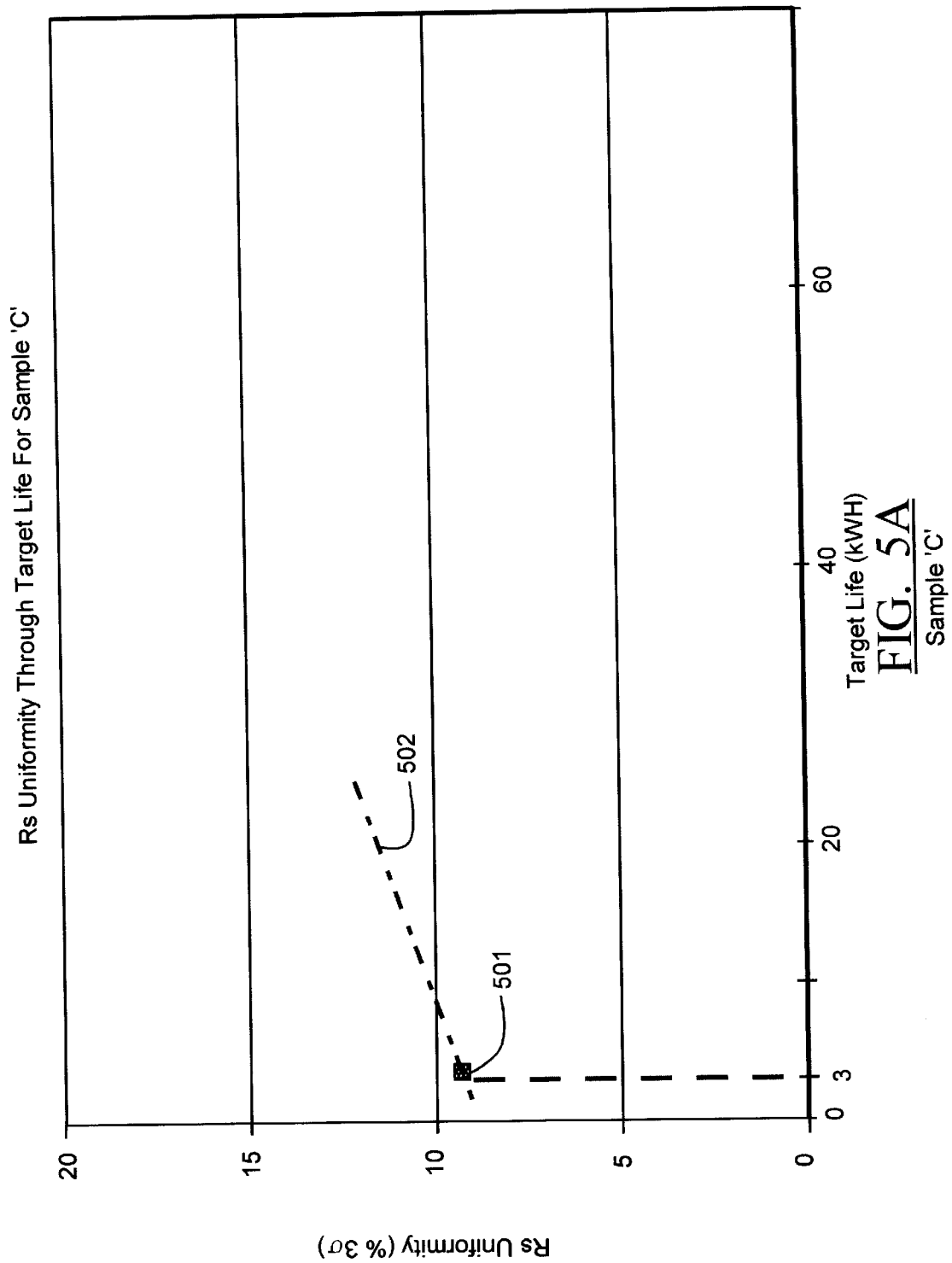
FIG. 5A shows a plot of through-life uniformity of across-the-wafer deposition for a third nickel target (Sample 'C')
Figure 5B:
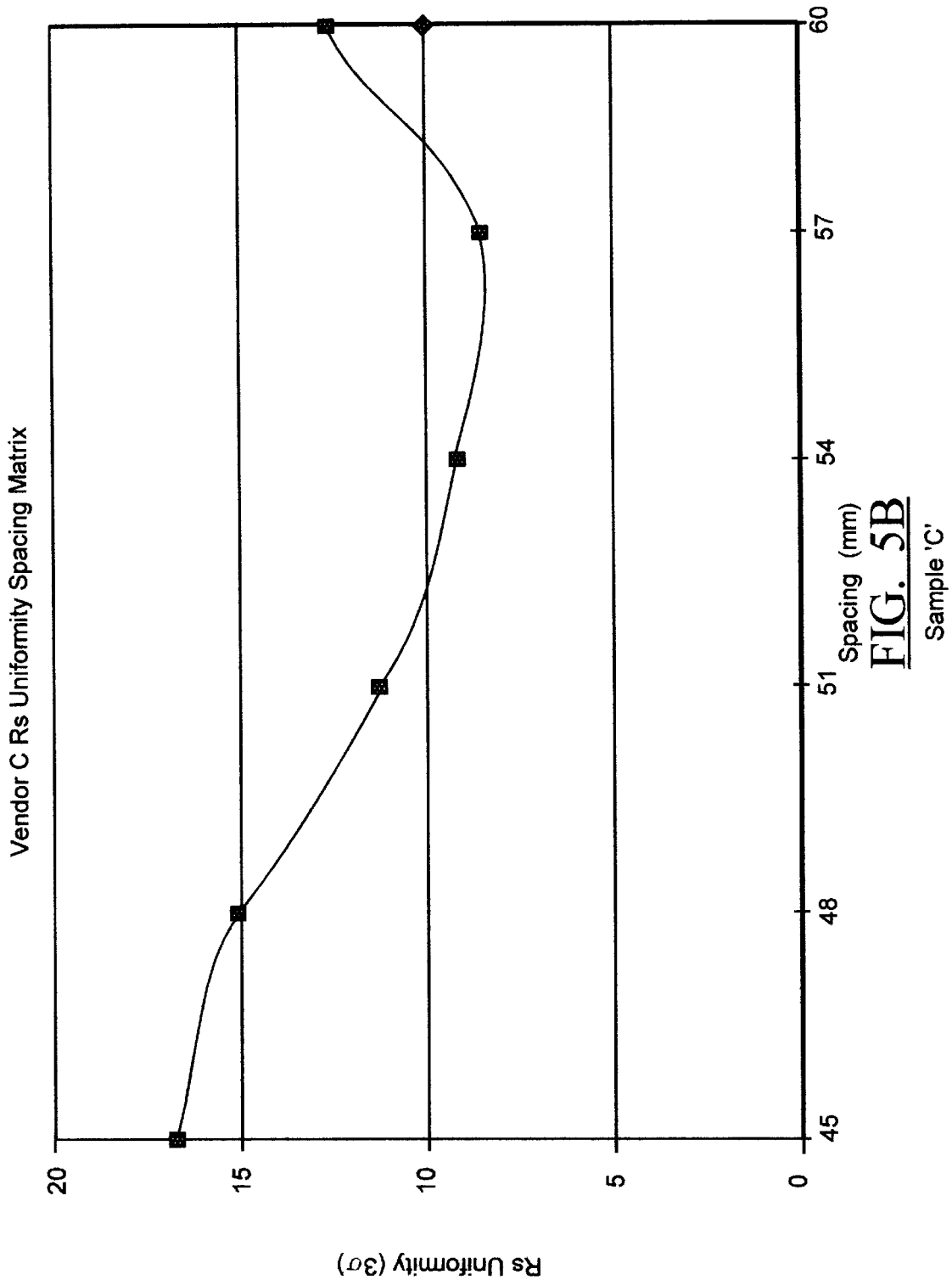
FIG. 5B plots target-to-wafer spacing curves relative to across-the-wafer deposition uniformity for the third nickel target (Sample 'C')

FIG. 5A shows a single point experimental result for the sample 'C' target. The result 501 at 3 kWHrs indicated that subsequent use would produce poorer results because wafer deposition results were consistently asymmetric, this indicating that the sample 'C' target possessed asymmetric cold-working characteristics. This conclusion, that further use of the sample 'C' target would produce worse results, is represented by the upward-sloping, dash-dot line 502. As seen from projection 502, crossing over the <10% (3σ) level is expected immediately after about 3 kWHrs of use. FIG. 5B shows the T/W spacing experiment results at the 3 kWHrs point. The best spacing was around 57 mm and the uniformity from other spacings was substantially worse.

Figure 6A:
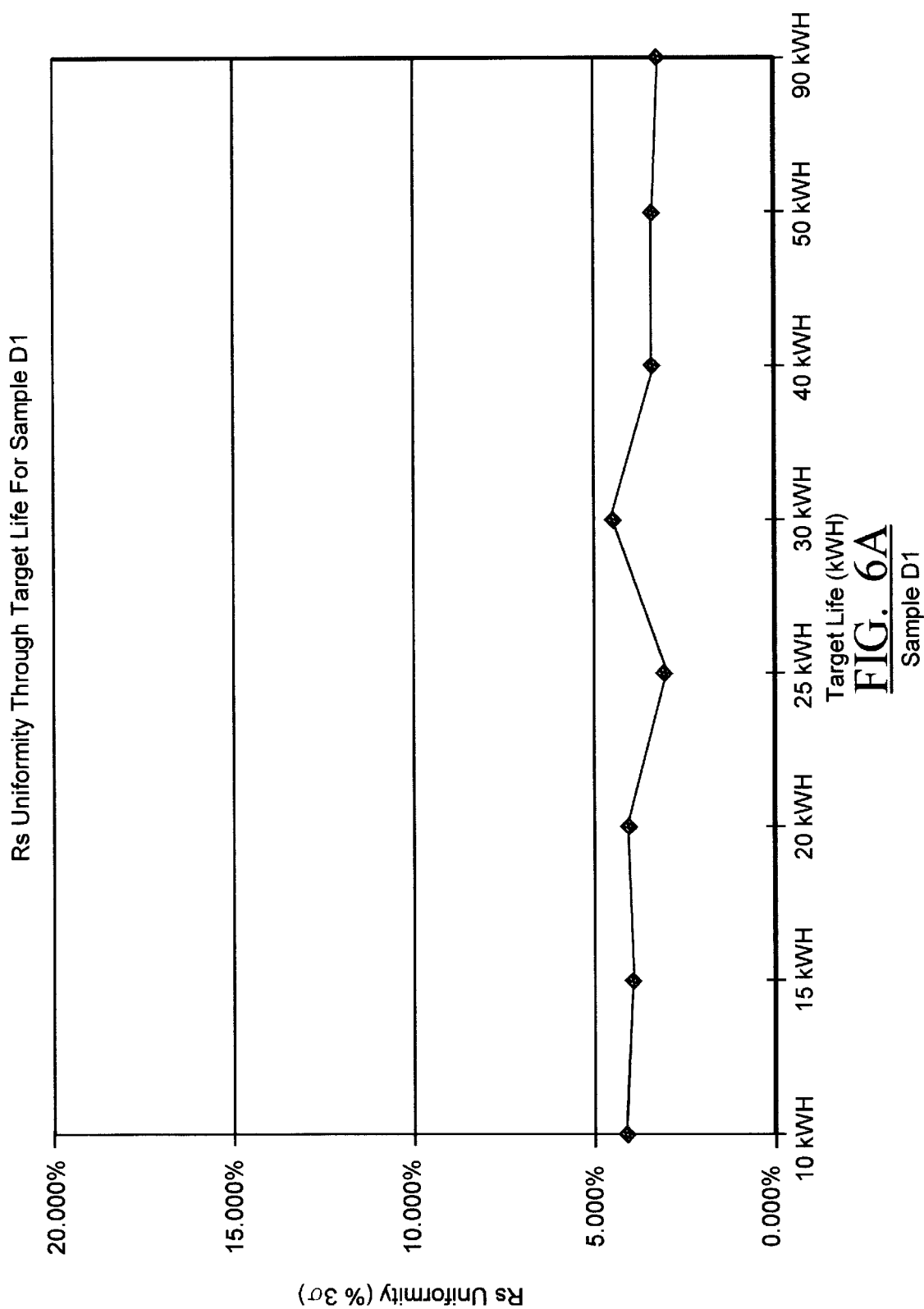
FIG. 6A plots through-life, across-the-wafer deposition uniformity for a fourth nickel target (Sample 'D1') when autospacing is invoked or mimicked.

FIG. 6A shows experimental results for sample 'D1' with auto-spacing again being mimicked by way of manual adjustment. (Essentially same results are expected with autospacing activated.) As seen from the drawn lines that connect the 8 sample points over the 90 kWHr lifespan of the target, resistivity remained continuously below the 5% (3σ) level throughout the 90 kWHr lifespan of the target. It is seen from this that commercially-acceptable nickel sputtering is possible throughout a 90 kWHr target life with appropriate adjustment of target characteristics. The overlife, general improvement in deposition uniformity is believed to be due to increasing % PTF values as target thickness shrinks by consumption. The odd point at 30 kWHrs is probably due to a T/W spacing change at that time.

FIG. 6B plots target-to-wafer spacing curves relative to across-the-wafer deposition uniformity for the fourth nickel target (Sample D1). The spacing was controlled manually to locate the minimum variation points over target life. As seen in FIG. 6B the plotted target/wafer spacing optimization curves for sample 'D1' include curves at 10 kWHr (triangle markers), at 20 kWHr (circle markers), at 30 kWHr (solid square markers), at 40 kWH (X markers), at 50 kWHr (X'd triangle markers), and at 90 kWHr (hollow square markers), each being relative to observed edge-to-edge deposition uniformity of the corresponding workpieces. The best uniformity results were about 5% (3σ) as seen for all curves at a T/W spacing of about 49.5 mm. At the T/W spacing of 57 mm, one can see the increasing detrimental effects of operating respectively over longer times, from 10 kWHr through 90 kWHr. Less than 5% (3σ) operation is seen for the 10–30 kWHr curves at a T/W spacing of about 51 mm. Less than 5% (3σ) operation is seen for the 30–90 kWH curves at a T/W spacing of about 48 mm. Thus commercially-acceptable nickel sputtering is possible throughout a 90 kWHr target life with appropriate adjustment of T/W spacing (to between 51–53 mm in the first 20 kWHr of operating life and to between 47–49 mm in the later 30–90 kWH of operating life).

Figure 7A:
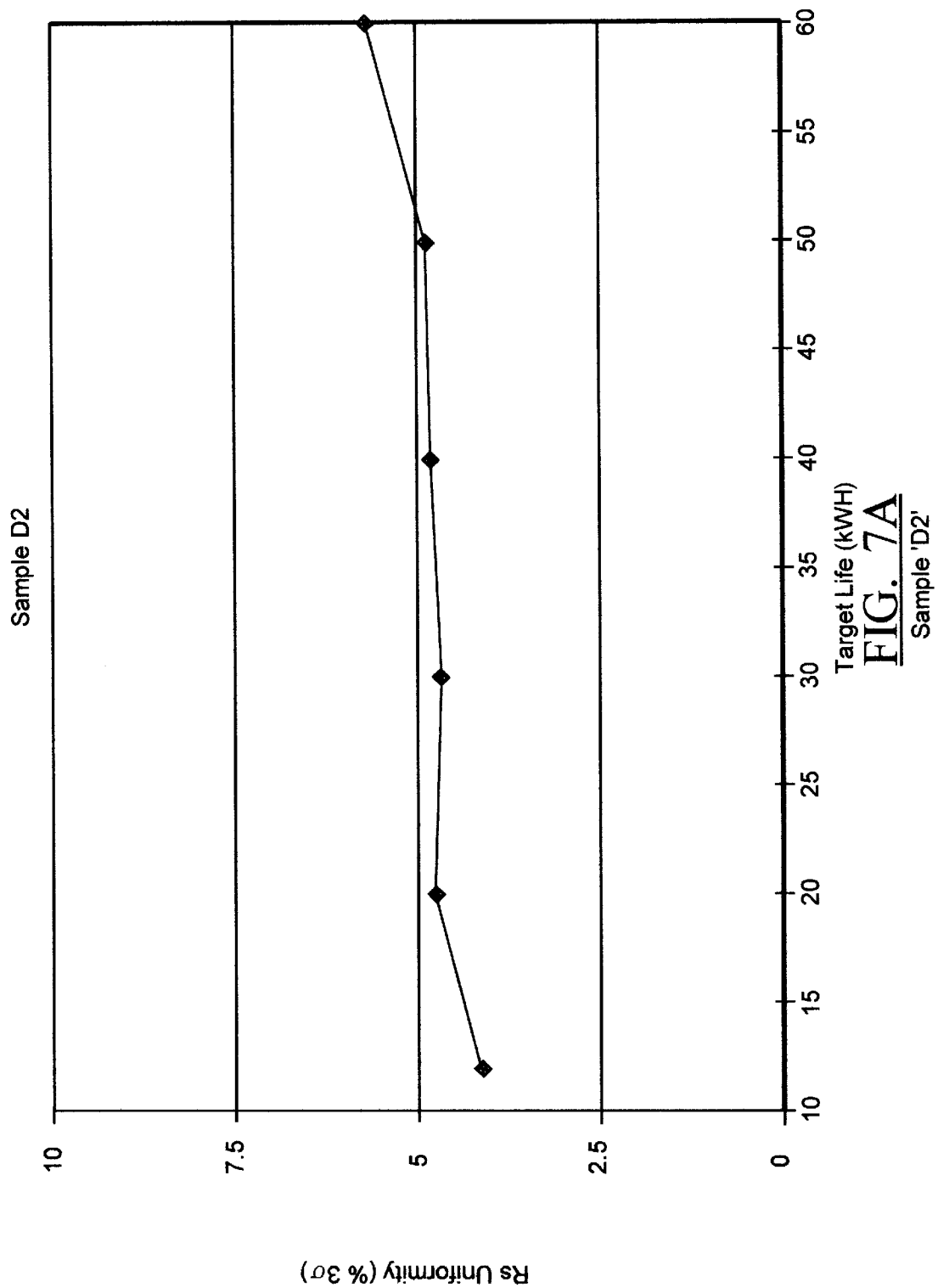
FIG. 7A plots through-life, across-the-wafer deposition uniformity for a fifth nickel target (Sample D2) when autospacing is invoked or mimicked.
Figure 7B:
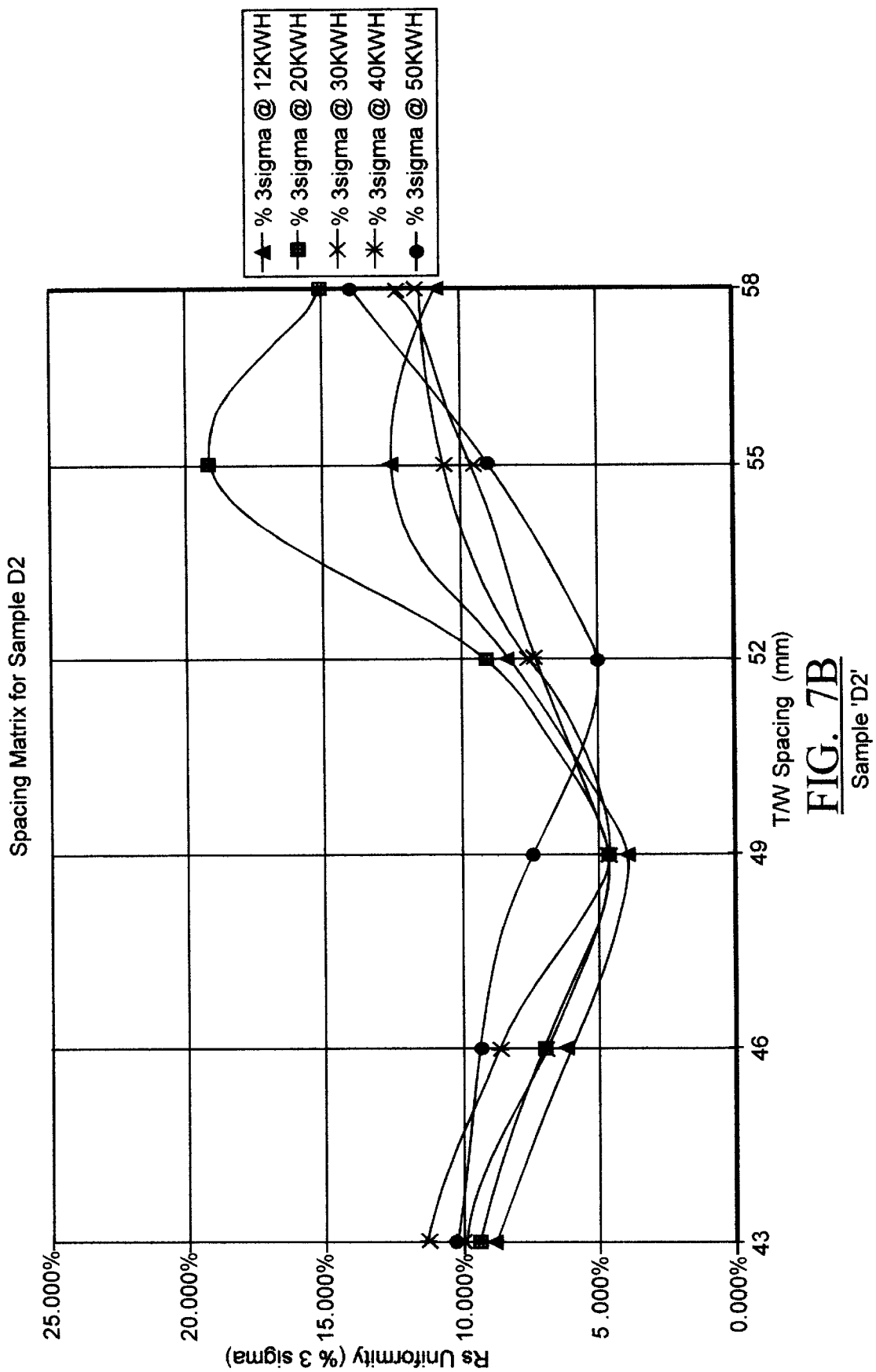
FIG. 7B plots target-to-wafer spacing curves relative to across-the-wafer deposition uniformity for the fifth nickel target (Sample D2).

FIG. 7A shows experimental results for the sample 'D2' target with auto-spacing again mimicked by manual adjustment. As seen the <5% (3σ) line is crossed over at about 50 kWHrs. FIG. 7B shows the corresponding T/W spacing matrix results for sample 'D2'.

Referring again to Table 1, a number of conclusions may be drawn. Clearly, the initial value of % PTF alone is not determinative of lifespan below the <5% (3σ) level. This is demonstrated by samples 'D1' and 'D2' having a same % PTF and yet sample 'D1' having a lifespan that is 80% greater than that of sample 'D2'. The uniformity results of sample 'B' over its 60 kWHrs lifespan is significantly worse than that of 'D1' even though 'B' has the highest % PTF value (55%). Sample 'C' has an extremely short lifespan under the <10% (3σ) level even though its % PTF (45%) is the second largest.

On the other hand, sample 'D1' has the highest relative amount of <200> texture content and the longest lifespan below the <5% (3σ) level amongst all the samples. This gives support to the proposition that <200> texture content plays an important, beneficial role in determining target lifetime. Sample 'C' has more relative <200> content than sample 'A' and yet sample 'A' has a longer lifespan under the <10% (3σ) level. One difference is that sample 'A' has relatively less <111> content. Sample 'C' has relatively high content of both <111> and <113> textures. The triple-asterisk column (TFM) appears to define a rough, relative figure of merit that is applicable to the lifespan under the <10% (3σ) level of samples 'A', 'B' and 'C'. It does not work for explaining the different lifespans of samples 'D1' and 'D2' though.

It appears that texture alone is not determinative of the lifespan and uniformity results. The smaller grain size of 'D2' may beneficially counter-compensate for its relatively high and detrimental amount of <111> texture content. It may be postulated that a successive series of <111> grains encourage shunting while insertion of <200> or otherwise textured grains into the series discourages such shunting.

The smaller the grains, the more likely it is that differently textured grains will be intermixed. Also, small granularity enhances uniform deposition of nonmagnetic materials.

From the above, a framework of preferences can be worked out. A relatively large amount of <200> texture is desirable as seen by comparing sample 'D1' against all the other samples. Reduction of the amount of <111> texture is desirable on a second order analysis as seen by comparing sample 'D1' against 'D2' or by comparing samples 'A' and 'B' against 'C'. Reduction of the combined amounts of <111> and <113> textures is desirable on a third order analysis as seen by the poor uniformity performance of sample 'C'. Reduction of grain size is also desirable as understood from general workings of sputtering systems. A relatively large, initial % PTF is desirable as seen by comparing sample 'B' against samples 'A' and 'C'. Also, it is generally seen in the lifespan plots (e.g., FIGS. 4, 6) that uniformity improves as target thickness decreases due to material consumption over time. It is understood that % PTF increases as thickness decreases. Thus, a relatively large initial % PTF is desirable.

Accordingly, one embodiment in accordance with the present invention uses a ferromagnetic target having the characteristics of sample 'D1' or better characteristics (e.g., 3 mm thickness, more <200> content, less <111> content, less <113> content, smaller grains, and/or higher initial % PTF). This embodiment is used in combination with an auto-spacing DC_magnetron PVD system 100 that auto-adjusts T/W spacing 128 (FIG. 1) over target usage life advances so as to obtain the essentially lowest values of across-the-wafer uniformity variation. In such an auto-spacing system, real-time clock 107 may be used to assist computer 106 with the step of determining how many kWH's of usage the target 120 has experienced. Motor 105 is operated accordingly under control of the computer 106 to provide automatic adjustment of the T/W spacing 128 as target usage life accumulates.

It is alternatively contemplated that a target's erosion life can be measured in terms of the sum of the deposition thicknesses on all the workpieces 150 processed by the given target or an equivalent (e.g., total number of wafers processed if deposition thickness is essentially the same on each). A typical value of total deposition thickness for a nickel target might be 400 μm. Accordingly, an alternate embodiment an auto-spacing DC_magnetron PVD system 100 in accordance with the present invention that adjusts T/W spacing 128 may use a computer 106 that counts the number of wafers processed or sums the measured or predicted thicknesses of deposition of the workpieces 150 processed by the given target 120 and automatically adjusts T/W spacing 128 accordingly. To find the optimal T/W spacing over life, test runs are performed with fixed T/W settings and then switchover points are selected from switching from one T/W setting to another depending on which fixed-T/W curve provides the best uniformity at the given period of the target's lifespan.

Table 2 lists some additionally observed characteristics of the sample 'D1' nickel target.

TABLE 2

| Sample D1 Observations | |
|---|---|
| Rs uniformity (3σ) | <5 |
| (Max-Min)/2 thickness uniformity | <5% |
| Mean Rs (Ω/sq) | 2.71 at 400 Å |

TABLE 2-continued

| Sample D1 Observations | |
|---|---|
| Bulk resistivity | 10.84 μΩ-cm |
| Deposition rate at 1500 W power | 23 Å/sec |

The present inventors have deduced, as a first order improvement, that the <200> texture content of the target should be at least 20% or greater so as to provide better effective edge-to-edge deposition uniformity. This is evidenced by comparing sample 'D2' against the poorer uniformities of samples 'A', 'B' and 'C'. Nickel has a face-centered cubic (FCC) crystal structure similar to that of aluminum. Accordingly, the crystal orientation experience of aluminum is believed transferable to nickel, with the additional factor that problems imposed by de-shunting of magnetic flux are introduced. A 32% or greater on average <200> texture content has been shown to be yet more beneficial for more uniform deposition as seen by comparing sample 'D1' against sample 'D2'.

The general results of all of samples 'A' through 'D2' indicates that larger amounts of <200> texture are continuously beneficial, at least over the range of 8% to about 33% <200> texture. Sample D1 demonstrates that values of <200> texture content greater than 30% are within reach of current target manufacturing processes. The wide range of <200> texture content in the tested samples suggests that a <200> texture content of 35% or greater is within reach of current target manufacturing processes. Comparison of sample 'D1' and 'D2' indicates that a roughly one-third decrease in <200> texture content, that is dropping from 32.8% down to 23.3% corresponds with a roughly one-half decrease in effective lifespan at the Rs variation constraint of <5% (3σ), that is, from 90 kWHrs down to 50 kWHrs. Thus the beneficial effects of increasing <200> content appear to be more than linear, and more so among the samples, appears to provide better than quadratic benefits.

The present inventors have deduced, as a second order improvement, that the <111> texture content of the nickel target should be made as small as possible (e.g., at least less than 40%, and better yet, less than 10%) so as to provide even better effective edge-to-edge deposition uniformity. This is evidenced by comparing the poor performance of sample 'C' (which has 40% <111> content) against the better uniformities of samples 'A', and 'B'. This is further evidenced by comparing the poorer performance of sample 'D2' (which has 46% <111> content) against the better uniformity of sample 'D1' (which has 9% <111> content). Samples 'A', 'B' and 'C' are in one comparable class for the uniformity constraint of Rs <10% (3σ). Samples 'D1' and 'D2' are in a second comparable class for the uniformity constraint of Rs <5% (3σ).

It is not fully clear what effect <113> content has. The present inventors postulate, as a third order improvement, that after the <111> texture content of the nickel target has been made as small as possible (e.g., at least less than 40%, and better yet, less than 10%), it may be advisable to reduce <113> content so as to provide even better effective edge-to-edge deposition uniformity. This is evidenced by noting that of sample 'C' (which has 40% <111> content coupled with 28% <113> content) was the poorest performer. Sample 'D1' also had high <113> content (of about 32%). However, its high <200> content and relatively low <111> content (of about 9%) appear to have countered whatever detrimental effect the high <113> content (of about 32%) may have had on deposition uniformity. Nevertheless, it believed preferable to reduce <113> content. High <220> content alone does not appear to be detrimental as evidenced by sample 'B' being the best in its class despite its 77% content of <220> textured grains.

Although texture mix appears to be the primary factor for controlling deposition uniformity, the initial % PTF of the ferromagnetic target (e.g., nickel) should nonetheless be made as large as possible for the given thickness class (e.g., 30% or greater for the 3 mm thick nickel class) so as to minimize variation in across-the-wafer deposition thickness over the target's life due to magnetic pinch-off effect and the like. Samples 'B' through 'D2' demonstrate that large initial % PTF's in the range of 30% or greater are obtainable.

The present inventors have further deduced that metal grain size should be homogeneously less than 150 microns for the bulk of the particles so as to better improve uniformity of deposition. Sample 'C' and D2 demonstrate that such small grain size is obtainable. It is postulated that even smaller grain sizes in the range of about 100 μm to 50 μm or less are within reach of current metal working processes and that such smaller grain sizes will provide added benefit. Sample 'B' demonstrates that large grain size may be detrimental to good uniformity even if high values of initial % PTF are provided.

The present inventors have further deduced that isotropic working of the metal and essentially complete recrystallization thereafter so as to relieve work-induced strain are also helpful to providing good uniformity. Sample 'C' demonstrates that high % PTF (45%) and small grain size (100 μm) alone do not guarantee good uniformity (e.g., less than 5% (3σ) variation). This sample, as explained above, appeared to have asymmetries due to anisotropic working or incomplete recrystallization steps.

It is believed that optimal combinations of characteristics for ferromagnetic targets can be deduced by understanding how magnetic fields are distributed within the DC magnetron system 100 (FIG. 1) after the plasma 160 reaches steady state stability, and how this distribution leads to formation of pinch-off V-grooves over time. Higher initial % PTF values tend to reduce the rate of pinch-off V-groove formation simply because there is less flux to be de-shunted.

A target qualification method in accordance with the present invention tests supplied targets and proscribes or otherwise removes from use those which do not meet criteria for grain size, texture content, non-directional working, and % PTF. Metal grain size, and other working-induced characteristics may be determined using conventional metal characterization techniques. Texture content may be determined from X-ray diffraction analysis. % PTF can be determined by measuring flux intensity at the top and bottom sides of each sample target. Targets from appropriately sampled lots that meet the criteria set forth above may then be designated as conforming in accordance with accepted statistical techniques. Targets from appropriately sampled lots that do not meet one or more of the criteria set forth above should be excluded from PVD metal operations.

The above disclosure is to be taken as illustrative of the invention, not as limiting its scope or spirit. Numerous modifications and variations will become apparent to those skilled in the art after studying the above disclosure.

By way of example, although the discussions herein have focused on ferromagnetic targets formed from essentially pure Ni (4N or better), nickel alloys such as those of the formulation $Ni_{1-x}Si_x$, where $x \leq 1\%$ which are magnetic and have FCC crystal structures similar to essentially pure Ni are expected to behave similarly in terms of providing uniform across-the-wafer deposition.

Given the above disclosure of general concepts and specific embodiments, the scope of protection sought is to be defined by the claims appended hereto.

What is claimed is:

1. A target adapted to be received by a DC_magnetron PVD system wherein said target has a deposition-producing portion composed primarily of a magnetically and electrically conductive, to-be-deposited metal, which metal has a tendency to form polycrystals of face-centered cubic structure, including <200> and <111> textured polycrystals, and said deposition-producing portion of the target is further characterized by:
   (a) a homogeneous texture mixture that is at least 20% of the <200> texture and less than about 50% of the <111> texture; and
   (b) an initial pass-through flux factor (% PTF) which is large enough to produce an initial flux for striking plasma.

2. A target according to claim 1 wherein said deposition-producing portion of the target is further characterized by:
   (b) an initial pass-through flux factor (% PTF) of about 30% or greater.

3. A target according to claim 1 wherein said deposition-producing portion of the target is further characterized by:
   (a.1) a homogeneous texture mixture that is at least 30% of the <200> texture.

4. A target according to claim 3 wherein said deposition-producing portion of the target is further characterized by:
   (a.1) a homogeneous texture mixture that is at least 32% of the <200> texture.

5. A target according to claim 4 wherein said deposition-producing portion of the target is further characterized by:
   (a.1) a homogeneous texture mixture that is at least 35% of the <200> texture.

6. A target according to claim 1 wherein said deposition-producing portion of the target is further characterized by an initial thickness that is equal to or greater than about 3 millimeters and:
   (b.1) an initial pass-through flux factor (% PTF) of about 45% or greater.

7. A target according to claim 6 wherein said deposition-producing portion of the target is further characterized by:
   (b.1a) an initial pass-through flux factor (% PTF) of about 55% or greater.

8. A target according to claim 1 wherein said deposition-producing portion of the target is further characterized by:
   (c) an average or homogeneous grain size of about 200 μm or less.

9. A target according to claim 8 wherein said deposition-producing portion of the target is further characterized by:
   (c.1) a homogeneous grain size of about 150 μm or less.

10. A target according to claim 9 wherein said deposition-producing portion of the target is further characterized by:
   (c.1a) a homogeneous grain size of about 100 μm or less.

11. A target according to claim 1 wherein said deposition-producing portion of the target is further characterized by:
   (c.1) a homogeneous texture mix that is less than 10% of the <111> texture.

12. A target according to claim 1 wherein said to-be-deposited metal includes nickel as a major component thereof.

13. A target according to claim 12 wherein said to-be-deposited metal consists essentially of nickel.

14. A target according to claim 12 wherein said to-be-deposited metal consists essentially of a nickel alloy having about 1% or less of non-nickel constituents and having FCC crystal structures.

15. The target of claim 1 and wherein said deposition-producing portion of the target is further characterized by:
   (c) an initial thickness of at least 3 mm which thickness corresponds to said initial pass-through flux factor (% PTF).

16. A DC_magnetron PVD system comprising:
   (a) flux producing means for producing a sourced magnetic flux;
   (b) a workpiece support for supporting a supplied workpiece; and
   (c) a ferromagnetic target spaced apart from said workpiece support, the ferromagnetic target being positioned along a magnetic flux path through which a portion of the sourced magnetic flux passes into a plasma-containing space situated between said target and said workpiece support;
      wherein said ferromagnetic target is characterized by:
      (c.1) a face-centered cubic constituency that has an average or homogeneous texture mixture that is about 20% or greater of a <200> texture and is less than about 50% of a <111> texture; and
      (c.2) an initial pass-through flux factor (% PTF) which is large enough to produce an initial flux for striking plasma.

17. A DC_magnetron PVD system according to claim 16 wherein said ferromagnetic target is further characterized by:
   (c.2a) an initial pass-through flux factor (% PTF) of about 30% or greater.

18. A DC_magnetron PVD system according to claim 16 wherein said ferromagnetic target is further characterized by:
   (c.3) a homogeneous grain size of about 150 $\mu$m or less.

19. A DC_magnetron PVD system according to claim 16 further comprising:
   (d) target-to-workpiece spacing adjusting means for adjusting a spacing between said target and the supplied workpiece; wherein said adjusting means adjusts said target-to-workpiece spacing in response to a determined amount of magnetically-accelerated erosion of said target during the useful life of the target.

20. A DC_magnetron PVD system according to claim 19 wherein said amount of erosion is determined from an amount of power applied to said target and an amount of time over which said power was applied to the target.

21. A DC_magnetron PVD system according to claim 19 wherein said amount of erosion is determined from a number of workpieces processed by said target.

22. A method for operating a DC_magnetron PVD system adapted to receive a target for installation therein, wherein said target has a deposition-producing portion composed primarily of an electrically and magnetically conductive, to-be-deposited metal, said operating method comprising the steps of:
   (a) installing a target obtained in accordance with a certification program wherein said certification program qualifies the target as having at least the following characteristics:
   (a) a face-centered cubic constituency that has an average or homogeneous texture mix that is at least 20% <200> texture and less than about 50% <111> texture;
   (b) an initial pass-through flux factor (% PTF) which is large enough to produce an initial flux for striking plasma; and
   (c) a homogeneous grain size of about 200 $\mu$m or less.

23. A method for operating a DC_magnetron PVD system according to claim 22 wherein said certification program qualifies the target as having:
   (b) an initial pass-through flux factor (% PTF) of about 30% or greater.

24. A target adapted to be received by a DC_magnetron PVD system wherein said target has a deposition-producing portion composed primarily of a magnetically and electrically conductive, to-be-deposited metal, which metal has a tendency to form polycrystals of face-centered cubic structure, including <200> and <111> textured polycrystals, and said deposition-producing portion of the target is further characterized by:
   (a) a texture mixture having an average value with a predefined per-sample-point restriction of +/−10% or tighter, wherein said average value for the texture mixture is at least 20% of the <200> texture and less than 50% of the <111> texture; and
   (b) an initial pass-through flux factor (% PTF) which is large enough to produce an initial flux for striking plasma.

25. The target of claim 24 and further characterized by:
   (a.1) a texture mixture having an average value with a predefined per-sample-point restriction of +/−10% or tighter, wherein said average value for the texture mixture is at least 30% of the <200> texture and less than 10% of the <111> texture.

26. The target of claim 24 and further characterized by:
   said to-be-deposited metal being useful for deposition on semiconductor substrates.

27. The target of claim 24 and further characterized by:
   said to-be-deposited metal including nickel as a major component thereof.

28. A target adapted to be received by a DC_magnetron PVD system wherein said target has a deposition-producing portion composed primarily of a magnetically and electrically conductive, to-be-deposited metal, which metal has a tendency to form polycrystals of face-centered cubic structure, including <200>, <111>, <113> and <220> textured polycrystals, and said deposition-producing portion of the target is further characterized by:
   (a) a texture mixture having an average value with a predefined per-sample-point restriction of +/−10% or tighter, wherein said average value for the texture mixture satisfies the Texture Figure of Merit imbalance condition:

$$57 < TFM = \frac{12 * Power(\langle 200 \rangle \cdot 2.5)}{(\langle 111 \rangle + \langle 113 \rangle + \langle 111 \rangle \langle 113 \rangle \langle 220 \rangle / 20)}$$

where Power(a,b) means value a raised to the b_th power and said texture variables in said TFM equation represent respective percentages of content of the correspondingly textured polycrystals.

29. The target of claim 28 and further characterized by:

said to-be-deposited metal including nickel as a major component thereof.

30. The target of claim 29 and further characterized by:

said to-be-deposited metal consisting essentially of nickel.

31. The target of claim 28 and wherein said deposition-producing portion of the target is further characterized by:

(b) an initial thickness of at least 3 mm and a corresponding initial pass-through flux factor (% PTF) of at least 30%.

* * * * *